United States Patent
Jeon

(10) Patent No.: US 11,057,226 B1
(45) Date of Patent: Jul. 6, 2021

(54) ELECTRONIC DEVICE DETECTING CHANGE OF POWER MODE BASED ON EXTERNAL SIGNAL

(71) Applicant: Samsung Electronics Co., Ltd., Suwon-si (KR)

(72) Inventor: Philjae Jeon, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/995,086

(22) Filed: Aug. 17, 2020

(30) Foreign Application Priority Data

Jan. 8, 2020 (KR) .................... 10-2020-0002609

(51) Int. Cl.
| | |
|---|---|
| *H04L 12/10* | (2006.01) |
| *H04L 7/00* | (2006.01) |
| *H03K 5/00* | (2006.01) |
| *H03K 3/037* | (2006.01) |

(52) U.S. Cl.
CPC ............ *H04L 12/10* (2013.01); *H03K 3/037* (2013.01); *H03K 5/00006* (2013.01); *H04L 7/0016* (2013.01)

(58) Field of Classification Search
CPC ....... H04L 12/10; H04L 7/0016; H03K 3/037; H03K 5/00006
See application file for complete search history.

(56) References Cited

U.S. PATENT DOCUMENTS

| | | | | | |
|---|---|---|---|---|---|
| 5,259,002 | A  * | 11/1993 | Carlstedt | ................. | H03M 5/06 375/260 |
| 6,452,420 | B1 * | 9/2002 | Wong | ........................ | H04L 5/20 326/30 |
| 6,694,377 | B1 * | 2/2004 | Beyer | ................. | G06F 13/4286 709/250 |
| 8,064,535 | B2 * | 11/2011 | Wiley | ................. | H04L 25/4917 375/288 |

(Continued)

FOREIGN PATENT DOCUMENTS

JP 2017-112427 A 6/2017

OTHER PUBLICATIONS

J. Han, P. Lee, Y. Kim, S. Kim, J. Park and Y. Jang, "A clock recovery for 2.56 GSymbol/s MIPI C-PHY receiver," 2017 International SoC Design Conference (ISOCC), Seoul, Korea (South), 2017, pp. 246-247, doi: 10.1109/ISOCC.2017.8368876. (Year: 2017).*

*Primary Examiner* — James M Perez
(74) *Attorney, Agent, or Firm* — Harness, Dickey & Pierce, P.L.C.

(57) ABSTRACT

Disclosed is electronic device configured to switch a power mode from a first mode to a second mode as a first time interval and a second time interval sequentially pass. The electronic device includes a first mode receiver, a second mode detector, and a second mode verifier. The first mode receiver outputs a first detection signal, based on three or more receive signals, when the first time interval begins. The second mode detector outputs a second detection signal, based on the first detection signal and a change in voltage (Continued)

levels of the three or more receive signals, when the second time interval begins. When the second detection signal is received, the second mode verifier detects an option pattern generated by the three or more receive signals and verifies that the second time interval begins.

20 Claims, 12 Drawing Sheets

(56) References Cited

U.S. PATENT DOCUMENTS

| | | | | |
|---|---|---|---|---|
| 8,472,245 B2* | 6/2013 | Kim | ............... | G11C 16/0483 |
| | | | | 365/185.03 |
| 8,472,551 B2* | 6/2013 | Wiley | ............... | H04L 25/0298 |
| | | | | 375/288 |
| 8,549,331 B2* | 10/2013 | Karam | ............... | H04L 1/22 |
| | | | | 713/300 |
| 8,773,916 B2* | 7/2014 | Kim | ............... | G11C 16/3459 |
| | | | | 365/185.22 |
| 8,917,793 B2* | 12/2014 | Mori | ............... | H04B 1/74 |
| | | | | 375/288 |
| 9,083,598 B2* | 7/2015 | Wiley | ............... | H04L 25/0298 |
| 9,224,483 B2* | 12/2015 | Kim | ............... | G11C 16/3454 |
| 9,455,850 B2* | 9/2016 | Wiley | ............... | H04L 25/0272 |
| 9,520,988 B1* | 12/2016 | Wiley | ............... | H04L 25/4923 |
| 9,520,998 B2* | 12/2016 | Balakrishnan | ............... | G06F 21/575 |
| 9,584,227 B2* | 2/2017 | Wiley | ............... | G06F 13/387 |
| 9,621,333 B2* | 4/2017 | Wiley | ............... | H04L 25/14 |
| 9,672,177 B2* | 6/2017 | Poulsen | ............... | H04J 3/06 |
| 9,680,666 B2* | 6/2017 | Wiley | ............... | H04L 5/20 |
| 9,906,358 B1* | 2/2018 | Tajalli | ............... | H03L 7/093 |
| 9,948,485 B2* | 4/2018 | Wiley | ............... | H04L 5/20 |
| 9,961,174 B2* | 5/2018 | Li | ............... | H04L 25/0272 |
| 9,985,745 B2* | 5/2018 | Shokrollahi | ............... | H04L 1/0054 |
| 9,998,300 B2* | 6/2018 | Wiley | ............... | H04L 25/4917 |
| 10,027,504 B2* | 7/2018 | Wiley | ............... | H04L 12/40136 |
| 10,033,560 B2* | 7/2018 | Wiley | ............... | H04L 27/22 |
| 10,127,167 B2* | 11/2018 | Lee | ............... | H04L 25/4917 |
| 10,298,214 B2* | 5/2019 | Shim | ............... | H03K 5/135 |
| 10,333,741 B2* | 6/2019 | Shokrollahi | ............... | H04L 25/0276 |
| 10,355,894 B2* | 7/2019 | Wiley | ............... | H04L 27/2057 |
| 10,827,605 B2* | 11/2020 | Kim | ............... | H05K 1/0245 |
| 10,924,090 B2* | 2/2021 | Kimura | ............... | G11C 11/16 |
| 2005/0204057 A1* | 9/2005 | Anderson | ............... | H04L 69/18 |
| | | | | 709/236 |
| 2006/0077888 A1* | 4/2006 | Karam | ............... | H04L 12/10 |
| | | | | 370/216 |
| 2006/0117089 A1* | 6/2006 | Karam | ............... | H04L 1/22 |
| | | | | 709/208 |
| 2007/0063942 A1* | 3/2007 | Itoigawa | ............... | G09G 5/006 |
| | | | | 345/87 |
| 2007/0160155 A1* | 7/2007 | Choi | ............... | H04L 25/085 |
| | | | | 375/257 |
| 2007/0164883 A1* | 7/2007 | Furtner | ............... | H04L 25/4908 |
| | | | | 341/126 |
| 2011/0292724 A1* | 12/2011 | Kim | ............... | G11C 16/3454 |
| | | | | 365/185.03 |
| 2014/0226734 A1* | 8/2014 | Fox | ............... | H03K 19/017509 |
| | | | | 375/259 |
| 2014/0241465 A1* | 8/2014 | Itoigawa | ............... | H04L 25/0272 |
| | | | | 375/316 |
| 2015/0204933 A1* | 7/2015 | Jeon | ............... | H04B 3/46 |
| | | | | 324/750.01 |
| 2015/0206273 A1* | 7/2015 | Jeon | ............... | G09G 5/008 |
| | | | | 348/521 |
| 2017/0032757 A1* | 2/2017 | Itoigawa | ............... | G09G 5/008 |
| 2017/0116150 A1* | 4/2017 | Wiley | ............... | G06F 13/4282 |
| 2017/0117979 A1* | 4/2017 | Sengoku | ............... | G06F 21/85 |
| 2017/0118039 A1* | 4/2017 | Wiley | ............... | H04L 12/40032 |
| 2017/0285134 A1* | 10/2017 | Stokes | ............... | G01S 7/6263 |
| 2018/0019863 A1* | 1/2018 | Liao | ............... | H04L 7/04 |
| 2018/0054336 A1* | 2/2018 | Hori | ............... | H03L 7/0812 |
| 2018/0091122 A1* | 3/2018 | Shim | ............... | H03K 5/19 |
| 2018/0238971 A1* | 8/2018 | Bennett | ............... | G01R 31/40 |
| 2019/0266119 A1* | 8/2019 | Wiley | ............... | G06F 13/4068 |
| 2020/0235949 A1* | 7/2020 | Jones | ............... | H04L 12/40045 |

* cited by examiner

ELECTRONIC DEVICE DETECTING CHANGE OF POWER MODE BASED ON EXTERNAL SIGNAL

CROSS-REFERENCE TO RELATED APPLICATIONS

This application claims priority under 35 U.S.C. § 119 to Korean Patent Application No. 10-2020-0002609 filed on Jan. 8, 2020, in the Korean Intellectual Property Office, the disclosures of which are incorporated by reference herein in their entireties.

BACKGROUND

Example embodiments of the inventive concepts relate to an electronic device communicating with an external electronic device, and more particularly, relate to an electronic device receiving a signal from the external electronic device and detecting a change of a power mode.

Nowadays, various types of electronic devices are being used. The electronic device may perform a unique function and/or functions based on operations of various electronic circuits included therein. The electronic device may operate independently or while communicating with another electronic device. The electronic device may adopt an interface protocol for the purpose of communicating with the other electronic device.

For example, a transmission device may transmit a signal to a reception device in compliance with the interface protocol. The reception device may obtain data corresponding to a received signal by processing the received signal. Accordingly, to exchange data with each other, the transmission device and the reception device may communicate with each other in compliance with the interface protocol.

A power mode of the reception device may be changed based on the received signal. For example, the received signal may direct the power mode of the received signal so as to switch from a low speed mode to a high speed mode. The reception device may analyze the received signal and may detect that the power mode is changed. For the reception device to operate normally in the changed power mode, the reception device may need to detect a change of a power mode at a good and/or appropriate time.

SUMMARY

Embodiments of the inventive concepts provide an electronic device detecting a change of a power mode in a pre-begin interval based on an external signal.

According to a some example embodiments, an electronic device configured to switch a power mode from a first mode to a second mode as a first time interval and a second time interval sequentially pass may include a first mode receiver, a second mode detector, and a second mode verifier. The first mode receiver may be configured to output a first detection signal, based on at least three receive signals, when the first time interval begins. The second mode detector may be configured to output a second detection signal, based on the first detection signal and a change in voltage levels of the at least three receive signals, when the second time interval begins. The second mode verifier may be configured to detect an option pattern generated by the at least three receive signals and may verify that the second time interval has begun when the second detection signal is received.

According to some example embodiments, an electronic device configured to switch a power mode from a first mode to a second mode as a first time interval and a second time interval sequentially pass may include a first mode receiver and a second mode receiver. The first mode receiver may be configured to output a first detection signal, based on a first signal, a second signal, and a third signal, when a first time interval begins. The second mode receiver may be configured to output the first detection signal and a second detection signal of a first logical value, based on a first signal pair including the first signal and the second signal, a second signal pair including the second signal and the third signal, and a third signal pair including the first signal and the third signal, when a second time interval begins. The second mode receiver may include a first comparator that outputs a first comparison signal, based on first currents flowing by the first signal pair, a second comparator that outputs a second comparison signal, based on second currents flowing by the second signal pair, and a third comparator that outputs a third comparison signal, based on third currents flowing by the third signal pair. The first logical value of the second detection signal may be based on the first comparison signal, the second comparison signal, and the third comparison signal.

According to some example embodiments, an electronic device configured to switch a power mode from a first mode to a second mode as a first time interval and a second time interval sequentially pass may include a first mode receiver and a second mode receiver. The first mode receiver may be configured to, when the first time interval begins, output a first detection signal, based on a first signal, a second signal, and a third signal. The second mode receiver may detect an option pattern generated by a first difference signal being a difference between the first signal and the second signal, a second difference signal being a difference between the second signal and the third signal, and a third difference signal being a difference between the third signal and the first signal and to verify that the second time interval begins, when the first detection signal is received. When a voltage level of the second difference signal transitions, the second mode receiver may detect the option pattern, based on a voltage level of the first difference signal.

BRIEF DESCRIPTION OF THE FIGURES

The above and other objects and features of the inventive concepts will become apparent by describing in detail some example embodiments thereof with reference to the accompanying drawings.

DETAILED DESCRIPTION

Below, some example embodiments of the inventive concepts may be described in detail and clearly to such an extent that an ordinary one in the art may implement the inventive concepts.

Figure 1:
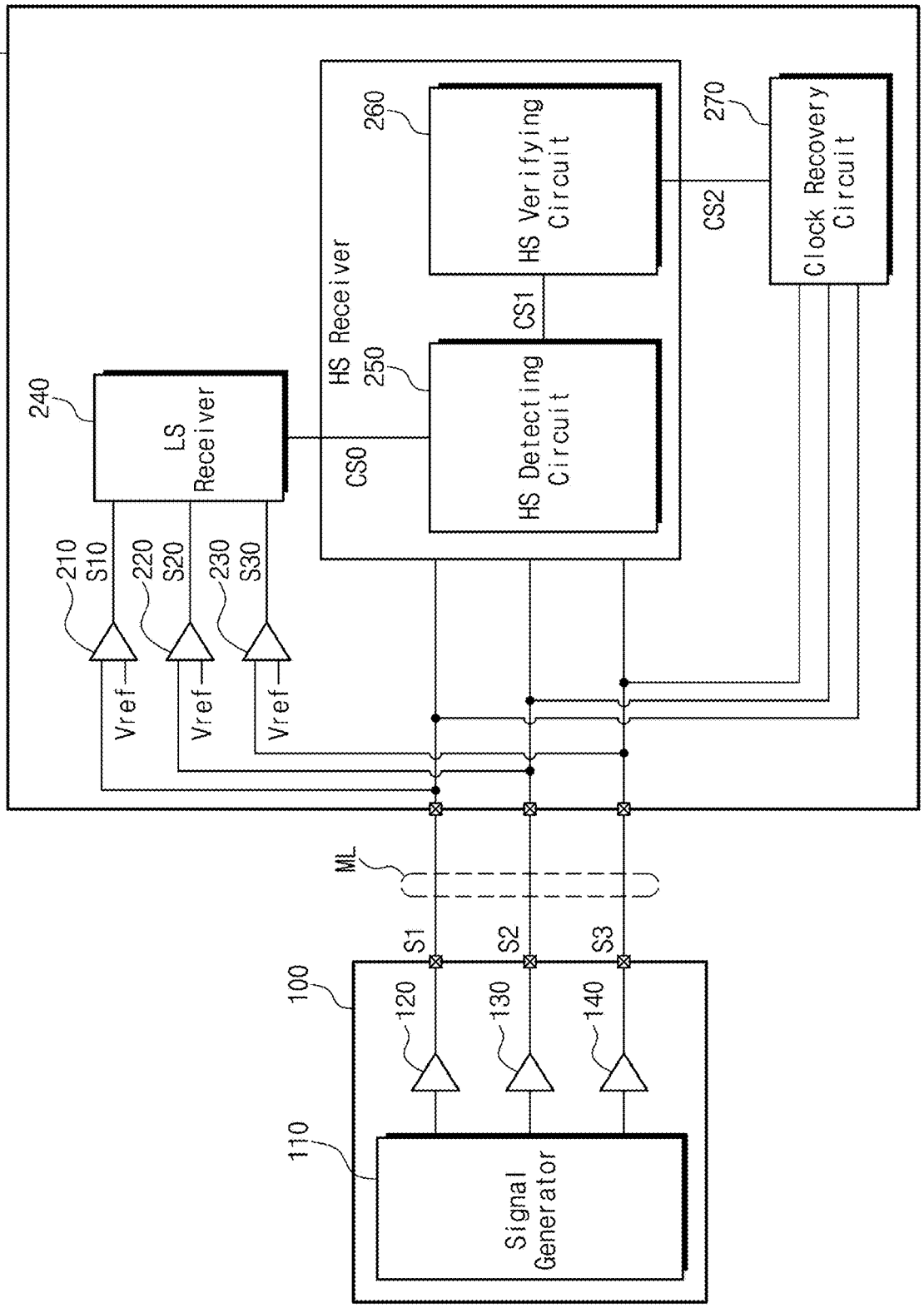
FIG. 1 illustrates an electronic device system according to some example embodiments.

FIG. 1 illustrates an electronic device system according to some example embodiments. Referring to FIG. 1, an electronic device system may include a first electronic device 100 and a second electronic device 200.

The first electronic device 100 may include a signal generator 110, a first transmitter 120, a second transmitter 130, and a third transmitter 140. The signal generator 110 may generate signals S1, S2, and S3. The first transmitter 120, the second transmitter 130, and the third transmitter 140 may output the signals S1, S2, and S3 through communication lines ML. Each of the signals S1, S2, and S3 may have a communication line. For example, in this example embodiment, there may be three or more communication lines.

The first transmitter 120, the second transmitter 130, and the third transmitter 140 may transmit signals in compliance with one of various communication protocols. For example, the first transmitter 120, the second transmitter 130, and the third transmitter 140 may transmit signals in compliance with a protocol, for example the C-PHY protocol defined by the mobile industry processor interface (MIPI). However, the embodiments of the inventive concepts are not limited thereto. For example, the first electronic device 100 may comprise three or more transmitters and/or communicating lines ML, and the first electronic device 100 and the second electronic device 200 may comply with the physical layer specifications and interface protocols associated with communication through three or more communication lines.

The second electronic device 200 may receive the signals S1, S2, and S3 through the communication lines ML. The second electronic device 200 may include a first receiver 210, a second receiver 220, a third receiver 230, a low speed mode ("LS") receiver 240, a high speed mode ("HS") detecting circuit 250, a high speed mode ("HS") verifying circuit 260, and a clock recovery circuit 270. Because the high speed mode detecting circuit 250 and the high speed mode verifying circuit 260 may be used to detect a high speed mode, the high speed mode detecting circuit 250 and the high speed mode verifying circuit 260 may be collectively referred to as a "high speed mode receiver" and/or an "HS receiver."

The first receiver 210, the second receiver 220, and the third receiver 230 may respectively receive the signals S1, S2, and S3 through the communication lines ML. The signals S1, S2, and S3 may also be referred to as receive signals S1, S2, and S3. Each of the receivers 210, 220, and 230 may receive a reference voltage Vref. The receivers 210, 220, and 230 may output signals S10, S20, and S30 based on voltage levels of the signals S1, S2, and S3 and a voltage level of the reference voltage Vref. For example, a voltage level of the signal S10 may be decided by a level difference between a voltage level of the signal S1 and a voltage level of the reference voltage Vref. Relationships between the output signals S20 and S30 and the received signals S2 and S3 may be substantially identical to the relationship between the output signal S10 and the received signal S1.

The low speed mode ("LS") receiver 240 may receive the signals S10, S20, and S30. In respective intervals of a low speed interval, the signals S10, S20, and S30 may have specific voltage levels. The low speed mode receiver 240 may detect that a preparation interval of the low speed interval has begun, based on a change in the voltage levels of the signals S10, S20, and S30. When the preparation interval of the low speed interval begins, the low speed mode receiver 240 may generate a control signal CS0. A "low speed interval" may mean a time interval where an electronic device operates in a low power and/or low speed mode. A "high speed interval" may mean a time interval where the electronic device operates in a high power and/or high speed mode. The preparation interval may be a time interval immediately before a power mode of the second electronic device 200 switches from the low speed mode to the high speed mode. T "A specific interval begins" may mean that an electronic device enters the specific interval.

The high speed mode detecting circuit 250 may receive the control signal CS0 and the signals S1, S2, and S3. When the control signal CS0 is received, the high speed mode detecting circuit 250 may be activated. The activated high speed mode detecting circuit 250 may detect that a preamble interval of the high speed mode begins, based on the signals S1, S2, and S3. The preamble interval may be a time interval, which first begins, from among continuous intervals of the high speed mode. For example, the preamble interval may be the interval after the control signal CS0 is received and may signal the start of the high speed mode. When the high speed mode detecting circuit 250 detects that the preamble interval begins, the high speed mode detecting circuit 250 may generate a control signal CS1.

The high speed mode verifying circuit 260 may receive the control signal CS1 and the signals S1, S2, and S3. When the control signal CS1 is received, the high speed mode verifying circuit 260 may be activated. The high speed mode verifying circuit 260 thus activated may verify whether the preamble interval has begun, based on the signals S1, S2, and S3. When it is verified that the preamble interval begins, the high speed mode verifying circuit 260 may output a control signal CS2.

Therefore, based on the control signal CS0, the high speed mode detecting circuit 250 and the high speed mode verifying circuit 260 may be deactivated in the low speed interval and may be activated in the high speed interval. Also, the high speed mode verifying circuit 260 may be activated from a time point when the control signal CS1 is received. Accordingly, the second electronic device 200 may operate with a lower power during the low speed intervals.

The clock recovery circuit 270 may receive the control signal CS2. When the control signal CS2 is received, the clock recovery circuit 270 may recover a clock signal from the signals S1, S2, and S3. For example, based on the C-PHY protocol, the first transmitter 120, the second transmitter 130, and the third transmitter 140 may transmit signals including data, with a clock signal combined with the signals. The combined clock signal may be, for example, an embedded clock. The embedded clock may also appear at the signals S1, S2, and S3.

The clock recovery circuit 270 may identify 1 UI (Unit Interval), based on a change in the voltage levels of the signals S1, S2, and S3. The clock recovery circuit 270 may identify 1 UI and may recover the clock signal.

In the case where the control signal CS2 is generated at an end point of the preamble interval, the clock recovery circuit 270 may fail to identify 1 UI normally. According to an example embodiment, the control signal CS2 may be generated at a start point of the preamble interval through operations of the high speed mode detecting circuit 250 and the high speed mode verifying circuit 260. That is, the clock recovery circuit 270 may normally operate based on the control signal CS2 generated at the start point of the preamble interval.

Even though the control signals CS1 and CS2 are generated before the preamble interval begins, the clock recovery circuit 270 may operate abnormally due to a noise. The influence of the noise may be reduced by using the high speed mode detecting circuit 250 based on a current. Also, the clock recovery circuit 270 may be prevented from operating abnormally by once more verifying whether the preamble interval begins by using the high speed mode verifying circuit 260.

Figure 2:
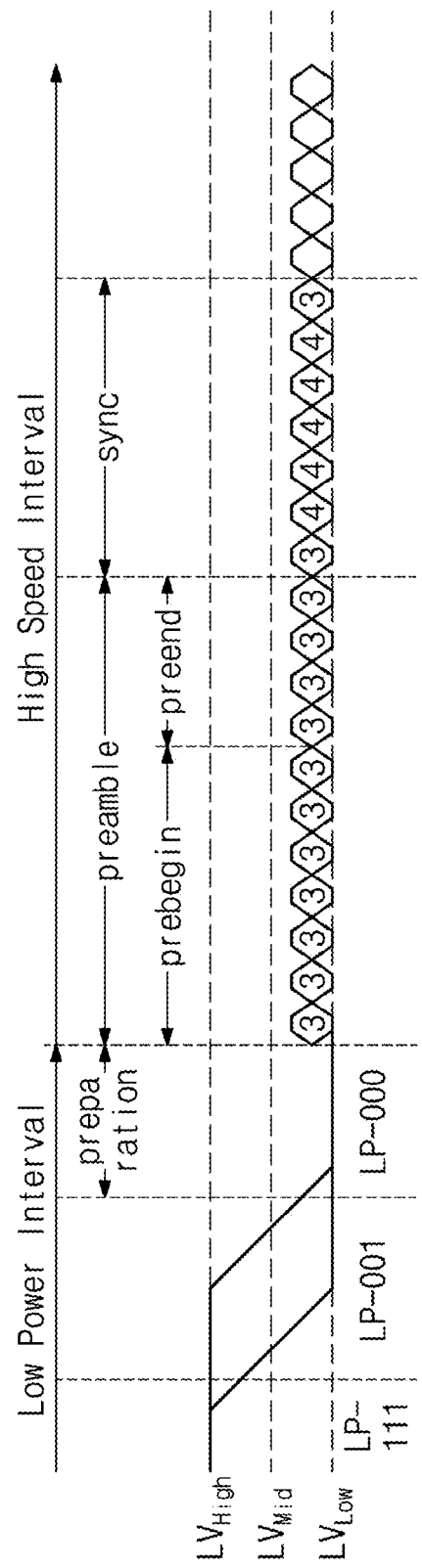
FIG. 2 is a graph for describing a low speed interval and a high speed interval.

FIG. 2 is a graph for describing a low speed interval and a high speed interval.

Referring to the graph of FIG. 2, a time interval where a power mode of the second electronic device 200 of FIG. 1 switches from the low speed mode to the high speed mode. A time interval in the low speed mode interval immediately before the power mode is switched to the high speed mode, is expressed by the preparation interval. That is, in the case whether the power mode is switched from the low speed mode to the high speed mode, the preparation interval may be a time interval in the low speed interval, which is performed last. Also, a time interval in the high speed mode interval immediately after the power mode is switched to the high speed mode, is expressed by the preamble interval. That is, in the case whether the power mode is switched from the low speed mode to the high speed mode, the preamble interval may be a time interval in the high speed interval, which is first performed.

In the low speed mode interval, voltage levels of the signals S1, S2, and S3 may vary depending on an interval (and/or over time). The signals S1, S2, and S3 may be voltage signals. For example, in the low speed interval, the signals S1, S2, and S3 may have a high voltage level $LV_{High}$, a middle voltage level $LV_{Mid}$, and/or a low voltage level $LV_{Low}$. The high voltage level $LV_{High}$ may be higher than the middle voltage level $LV_{Mid}$, and the middle voltage level $LV_{Mid}$ may be higher than the low voltage level $LV_{Low}$. In the low speed interval, the signal S1 may sequentially have the high voltage level $LV_{High}$, the low voltage level $LV_{Low}$, and the low voltage level $LV_{Low}$. In the low speed interval, also, the signal S2 may sequentially have the high voltage level $LV_{High}$, the low voltage level $LV_{Low}$, and the low voltage level $LV_{Low}$. In the low speed interval, the signal S3 may sequentially have the high voltage level $LV_{High}$, the high voltage level $LV_{High}$, and the low voltage level $LV_{Low}$.

The first receiver 210, the second receiver 220, and the third receiver 230 of FIG. 1 may compare the signals S1, S2, and S3 with the reference voltage Vref and may output the signals S10, S20, and S30. As voltage levels of the signals S1, S2, and S3 are changed, voltage levels of the signals S10, S20, and S30 may also be changed. The low speed mode receiver 240 of FIG. 1 may detect the preparation interval, based on a pattern in which the voltage levels of the signals S10, S20, and S30 vary. For example, when all the voltage levels of the signals S1, S2, and S3 are a low voltage level $LV_{Low}$, the low speed mode receiver 240 may output the control signal CS0.

After the preparation interval is completed, the high speed mode interval may begin. The high speed mode interval may include the preamble interval and a synchronization interval. The preamble interval of the high speed mode interval may first begin. In the preamble interval, the signals S1, S2, and S3 may be in the form of a clock signal that periodically transitions. In the preamble interval, the signals S1, S2, and S3 may indicate an option pattern defined by a protocol, for example, the C-PHY protocol. The signals S1, S2, and S3 may indicate various option patterns defined by the protocol. In the preamble interval, the signals S1, S2, and S3 may indicate one of the option patterns defined by the protocol.

The second electronic device 200 of FIG. 1 may obtain and/or store information about the option pattern defined by the protocol. The second electronic device 200 may verify whether an option pattern indicated by the signals S1, S2, and S3 is substantially identical to the option pattern defined by the protocol, based on the obtained and/or stored information. The second electronic device 200 may obtain the information about the option pattern defined by the protocol from the first electronic device 100 of FIG. 1. Also, the information about the option pattern defined by the protocol may be stored in the second electronic device 200 by a user. In this case, only the components associated with the option pattern defined by the protocol from among components of the high speed mode verifying circuit 260 of FIG. 1 may be activated.

In the preamble interval, the signals S1, S2, and S3 may indicate option pattern "1" and/or option pattern "3." The case where signals S1, S2, and S3 indicate option pattern "3" is illustrated in FIG. 2. Option pattern "3" and option pattern "1" will be described with reference to FIGS. 6 and 7, respectively.

The high speed mode detecting circuit 250 may detect that all the voltage levels of the signals S1, S2, and S3 transition to different levels from the low voltage level $LV_{Low}$ and may output the control signal CS1.

The high speed mode verifying circuit 260 of FIG. 1 may detect that the signals S1, S2, and S3 indicate a preamble option pattern and may output the control signal CS2. The "preamble option pattern" may mean an option pattern that is defined by the protocol so as to be indicated by the signals S1, S2, and S3 in the preamble interval. However, the present disclosure is not limited thereto. For example, the "preamble option pattern" may include an option pattern indicated by difference signals of signal pairs selected from the signals S1, S2, and S3.

The preamble interval may be divided into a pre-begin interval and a pre-end interval in a time-ordered sequence. The control signal CS1 and the control signal CS2 may be output in the pre-begin interval in the preamble interval through the high speed mode detecting circuit 250 and the high speed mode verifying circuit 260.

Figure 3:
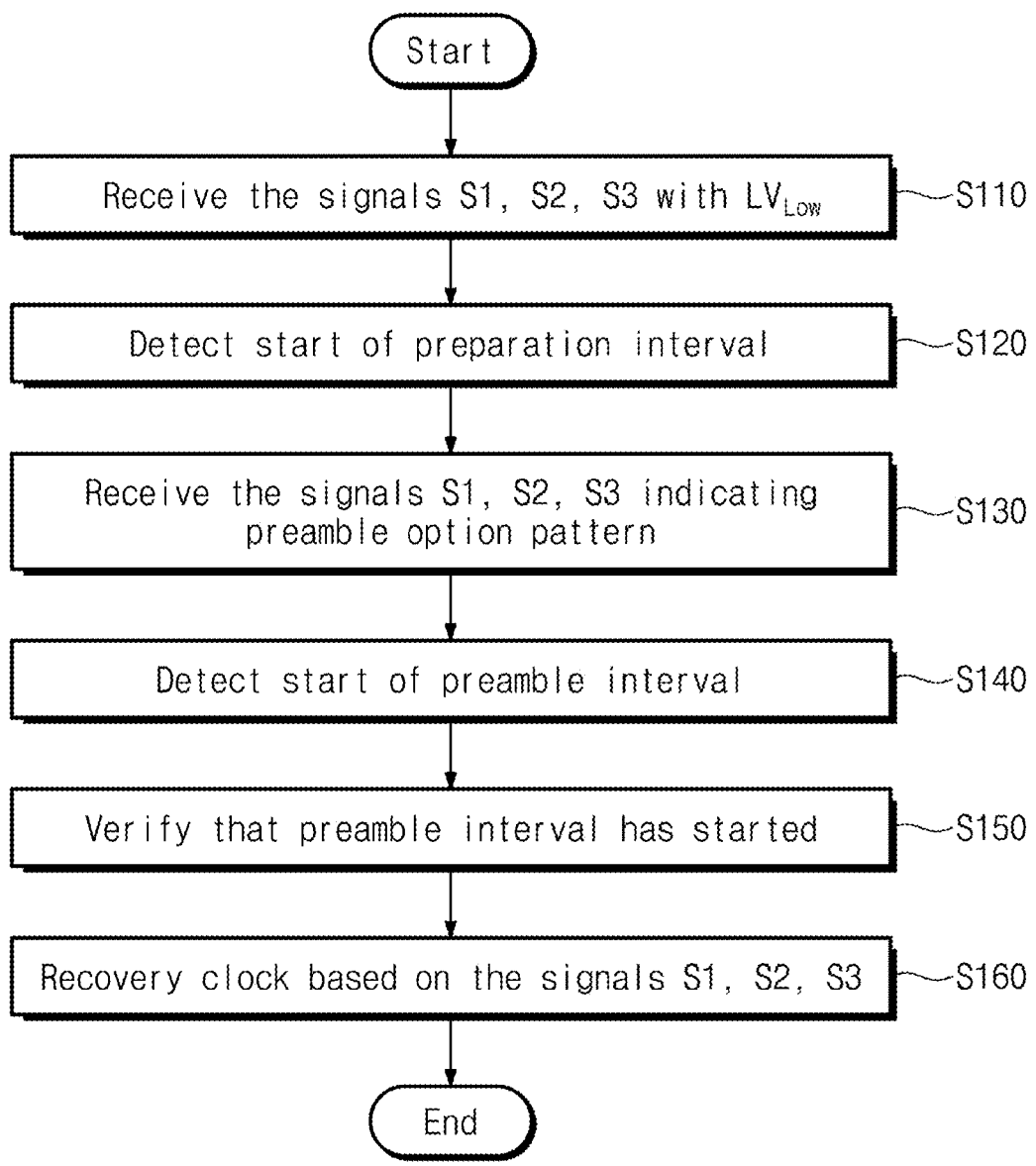
FIG. 3 is a flowchart for describing an operation of a second electronic device of FIG. 1.

FIG. 3 is a flowchart for describing an operation of a second electronic device of FIG. 1.

In operation S110, the second electronic device 200 of FIG. 1 may receive the signals S1, S2, and S3 from the first electronic device 100. In the low speed mode interval immediately before the power mode of the second electronic device 200 switches to the high speed mode, voltage levels of the signals S1, S2, and S3 may vary with a specific pattern. For example, in the preparation interval of FIG. 2, all the signals S1, S2, and S3 may have the low voltage level $LV_{Low}$.

When all the signals S1, S2, and S3 have the low voltage level $LV_{Low}$, in operation S120, the low speed mode receiver 240 of FIG. 1 may output the control signal CS0. Based on the signals S1, S2, and S3, the low speed receiver 240 may detect that the preparation interval begins. When it is detected that the preparation interval begins, the low speed mode receiver 240 may output the control signal CS0.

When the preparation interval begins after the preparation interval is completed, in operation S130, the second electronic device 200 may receive the signals S1, S2, and S3 indicating the preamble option pattern.

When the control signal CS0 is received, in operation S140, the high speed mode detecting circuit 250 of FIG. 1 may be activated. The activated high speed mode detecting circuit 250 may detect that the preamble interval begins, based on that the signals S1, S2, and S3 do not have the low voltage level $LV_{Low}$. When it is detected that the preamble interval begins, the high speed mode detecting circuit 250 may output the control signal CS1.

When the control signal CS1 is received, in operation S150, the high speed mode verifying circuit 260 of FIG. 1 may be activated. The activated high speed mode verifying circuit 260 may verify that the preamble interval begins, based on that the signals S1, S2, and S3 indicate the preamble option pattern. When it is detected that the preamble interval begins, the high speed mode verifying circuit 260 may output the control signal CS2.

When the control signal CS2 is received, in operation S160, the clock recovery circuit 270 may recover a clock signal based on the signals S1, S2, and S3.

Figure 4:
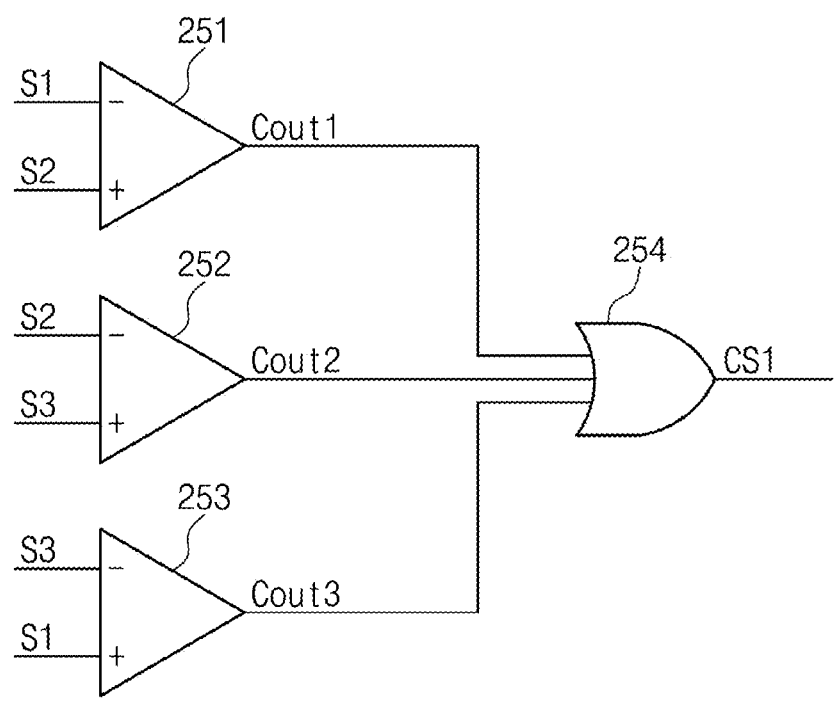
FIG. 4 is an example block diagram of a high speed mode detecting circuit of FIG. 1.

FIG. 4 is an example block diagram of a high speed mode detecting circuit of FIG. 1.

The high speed mode detecting circuit 250 of FIG. 4 may be understood as an example configuration for detecting that the preamble interval begins, based on the signals S1, S2, and S3. Referring to FIG. 4, the high speed mode detecting circuit 250 may include a first comparator 251, a second comparator 252, a third comparator 253, and a logic gate 254.

The first comparator 251 may receive the signals S1 and S2. The signals S1 and S2 may be respectively input to an inverting terminal and a non-inverting terminal of the first comparator 251, but the example embodiments are not limited thereto. The first comparator 251 may compare the signals S1 and S2 and may output a signal Cout1. In detail, when voltage levels of the signals S1 and S2 are equal, the signal Cout1 may have a first logical value. For example, the first logical value may be a logical value of "0." When the voltage levels of the signals S1 and S2 are different, the signal Cout1 may have a second logical value. For example, the second logical value may be a logical value of "1." However, the example embodiments is not limited thereto. For example, the signal Cout1 may have a voltage level corresponding to the first logical value or a voltage level corresponding to the second logical value.

The second comparator 252 may compare the signals S2 and S3 and may output a signal Cout2. Also, the third comparator 253 may compare the signals S3 and S1 and may output a signal Cout3. Besides, the second comparator 252 and the third comparator 253 may provide substantially the same operation as the first comparator 251, and thus, additional description will be omitted to avoid redundancy.

The logic gate 254 may receive the signals Cout1, Cout2, and Cout3. The logic gate 254 may perform an OR operation on the signals Cout1, Cout2, and Cout3 to generate the control signal CS1. When all the signals Cout1, Cout2, and Cout3 have the first logical value, the control signal CS1 may have the first logical value. When at least one of the signals Cout1, Cout2, and Cout3 has the second logical value, the control signal CS1 may have the second logical value.

That is, in the preparation interval of FIG. 2, the high speed mode detecting circuit 250 may output the control signal CS1 having the first logical value. When the preamble interval of FIG. 2 begins, the high speed mode detecting circuit 250 may output the control signal CS1 having the second logical value. "To output the control signal CS1 having the first logical value" and "to output the control signal CS1 having the second logical value" may respectively correspond to "not to output the control signal CS1" and "to output the control signal CS1."

Figure 5:
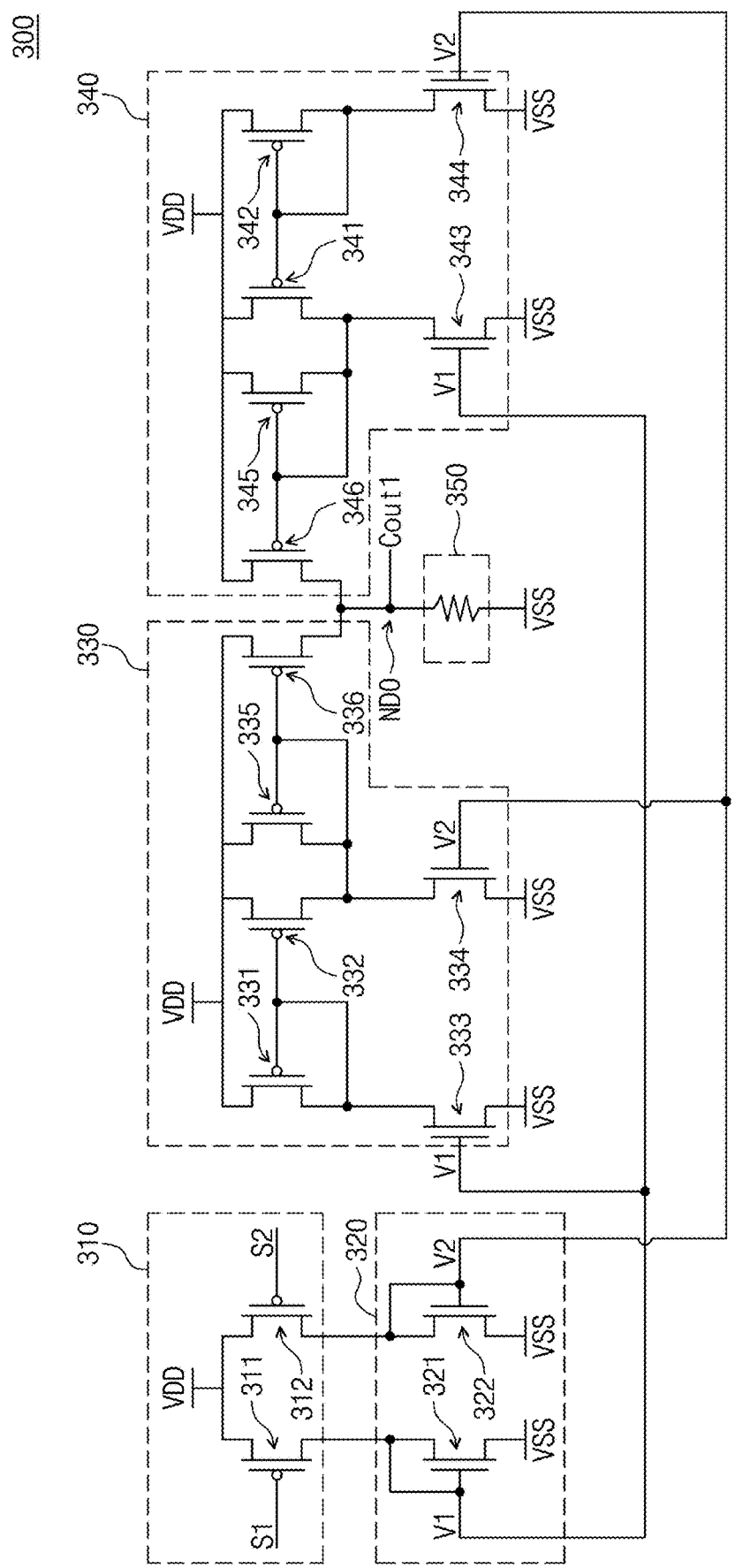
FIG. 5 is a block diagram for describing a comparator of FIG. 4.

FIG. 5 is a block diagram for describing a comparator of FIG. 4.

A comparator 300 of FIG. 5 may be included in the comparator 251 of FIG. 4. Because the comparators 252 and 253 of FIG. 4 are implemented to be substantially identical to the comparator 251, additional description associated with the comparators 252 and 253 will be omitted to avoid redundancy.

The comparator 300 may include a current output circuit 310, a control circuit 320, a first switch circuit 330, a second switch circuit 340, and a resistor 350.

The current output circuit 310 may include a plurality of transistors 311 and 312. In descriptions below, the current output circuit 310 includes two PMOS transistors, but the example embodiment is not limited thereto. Source terminals of the transistors 311 and 312 may be connected with a supply line. The source terminals of the transistors 311 and 312 may be provided with a supply voltage VDD from the supply line. Gate terminals of the transistors 311 and 312 may be provided with the signals S1 and S2, respectively. Drain terminals of the transistors 311 and 312 may be connected with drain terminals of the transistors 321 and 322, respectively.

In the preamble interval, the signals S1, S2, and S3 may have a first voltage level and/or a second voltage level. The first voltage level may be lower than the second voltage level. For example, the first voltage level may be a level of a ground voltage VSS, and the second voltage level may be a level of the supply voltage VDD.

The transistor 311 may be configured to output a current from the source terminal to the drain terminal based on the voltage levels of the signals. For example, when the signal S1 has the first voltage level, the transistor 311 may output a current from the source terminal to the drain terminal. In this case, a voltage level of the drain terminal of the transistor 311 may rise to the second voltage level. The voltage level of the drain terminal of the transistor 311 may also fail to reach the second voltage level due to a threshold voltage of the transistor 311 and a resistance of an electric wire. However, for convenience of description, a voltage drop due to the threshold voltage of the transistor 311 and the resistance of the electric wire is ignored. When the signal S1 has the second voltage level, the transistor 311 may not output the current from the source terminal to the drain terminal. In this case, the voltage level of the drain terminal of the transistor 311 may not be defined.

The transistor 312 provides substantially the same operations as the transistor 311, and thus, additional description will be omitted to avoid redundancy.

The control circuit 320 may include a plurality of transistors 321 and 322. In descriptions below, the control circuit 320 is described as including two NMOS transistors, but the example embodiments are not limited thereto. The drain terminals of the transistors 321 and 322 may be connected with the transistors 311 and 312, respectively. Gate terminals of the transistors 321 and 322 may be connected with the drain terminals thereof. Source terminals of the transistors 321 and 322 may be connected with a ground line. The source terminals of the transistors 321 and 322 may be provided with the ground voltage VSS from the ground line.

The voltage level of the ground voltage VSS may be lower than the voltage level of the supply voltage VDD.

The drain terminal of the transistor 321 may be connected with the drain terminal of the transistor 311. Because the gate terminal and the drain terminal of the transistor 321 are interconnected, the transistor 321 may output a current from the drain terminal to the source terminal, based on a voltage level of the drain terminal of the transistor 311. For example, when the voltage level of the drain terminal of the transistor 311 is the second voltage level, the transistor 321 may output a current from the drain terminal to the source terminal. When the voltage level of the drain terminal of the transistor 311 is not the second voltage level (e.g., when the voltage level of the drain terminal of the transistor 311 is the first voltage level), the transistor 321 may not output a current from the drain terminal to the source terminal. That is, when the voltage level of the signal S1 is the first voltage level, the voltage level of the gate terminal of the transistor 321 may be the second voltage level. When the voltage level of the signal S1 is the second voltage level, the voltage level of the gate terminal of the transistor 321 may not be defined.

The transistor 322 provides substantially the same operations as the transistor 321, and thus, additional description will be omitted to avoid redundancy.

The first switch circuit 330 may output a current to a node ND0, based on voltages V1 and V2. The voltage V1 and the voltage V2 may mean a voltage of the gate terminal of the transistor 321 and a voltage of the gate terminal of the transistor 322, respectively.

The first switch circuit 330 may include a plurality of transistors 331 to 336. The transistors 331 and 332 may operate as a current mirror circuit. The transistors 335 and 336 may also operate as a current mirror circuit. In descriptions below, it is assumed that the transistors 331, 332, 335, and 336 are PMOS transistors and the transistors 333 and 334 are NMOS transistors, but the example embodiments are not limited thereto.

The transistor 333 may receive the voltage V1 through a gate terminal thereof. The transistor 333 may output a current from the drain terminal to the source terminal, based on a voltage level of the voltage V1. For example, when a level of the voltage V1 is the first voltage level, the transistor 333 may not output a current from the drain terminal to the source terminal. Alternatively, when the level of the voltage V1 is the second voltage level, the transistor 333 may output the current from the drain terminal to the source terminal.

When a current does not flow through the transistor 333, a current may not flow through each of the transistors 331 and 332. When a current flows through the transistor 333, a current may flow through each of the transistors 331 and 332.

The transistor 334 may receive the voltage V2 through a gate terminal thereof. The transistor 334 may output a current from the drain terminal to the source terminal, based on a voltage level of the voltage V2. The transistor 334 may control the current flows through the transistors 335 and 336 in substantially the same operations as the transistor 333, and thus, additional description will be omitted to avoid redundancy.

For example, whether a current flows through each of the transistors 335 and 336 may be decided based on a voltage level of the drain terminal of the transistor 335. Whether the voltage level of the drain terminal of the transistor 335 is the first voltage level, a current may flow through each of the transistors 335 and 336. Whether the voltage level of the drain terminal of the transistor 335 is the second voltage level, a current may not flow through each of the transistors 335 and 336.

When voltage levels of the signals S1 and S2 are the second voltage level and the first voltage level, respectively, the first switch circuit 330 may output a current to the node ND0 through the operations of the plurality of transistors 331 to 336. When a voltage level of the signal S2 is the second voltage level, the first switch circuit 330 may not output a current to the node ND0 regardless of a voltage level of the signal S1.

An operation of the second switch circuit 340 may be substantially symmetrical to the operation of the first switch circuit 330, and thus, additional description will be omitted to avoid redundancy. When voltage levels of the signals S1 and S2 are the first voltage level and the second voltage level, respectively, the second switch circuit 340 may output a current to the node ND0 through the operations of the plurality of transistors 341 to 346. When a current is output to the node ND0, the node ND0 may have a voltage level proportional to the resistor 350. When a voltage level of the signal S1 is the second voltage level, the second switch circuit 340 may not output a current to the node ND0 regardless of a voltage level of the signal S2. When a current is not output to the node ND0, the node ND0 may have the first voltage level through the resistor 350.

As understood from the above operations of the first switch circuit 330 and the second switch circuit 340, when voltage levels of the signals S1 and S2 are different, a current may be output to the node ND0. When a current is output to the node ND0, a logical value of the signal Cout1 may be the second logical value. Also, when voltage levels of the signals S1 and S2 are identical, a current may not be output to the node ND0. When a current is not output to the node ND0, a logical value of the signal Cout1 may be the first logical value.

Figure 6:
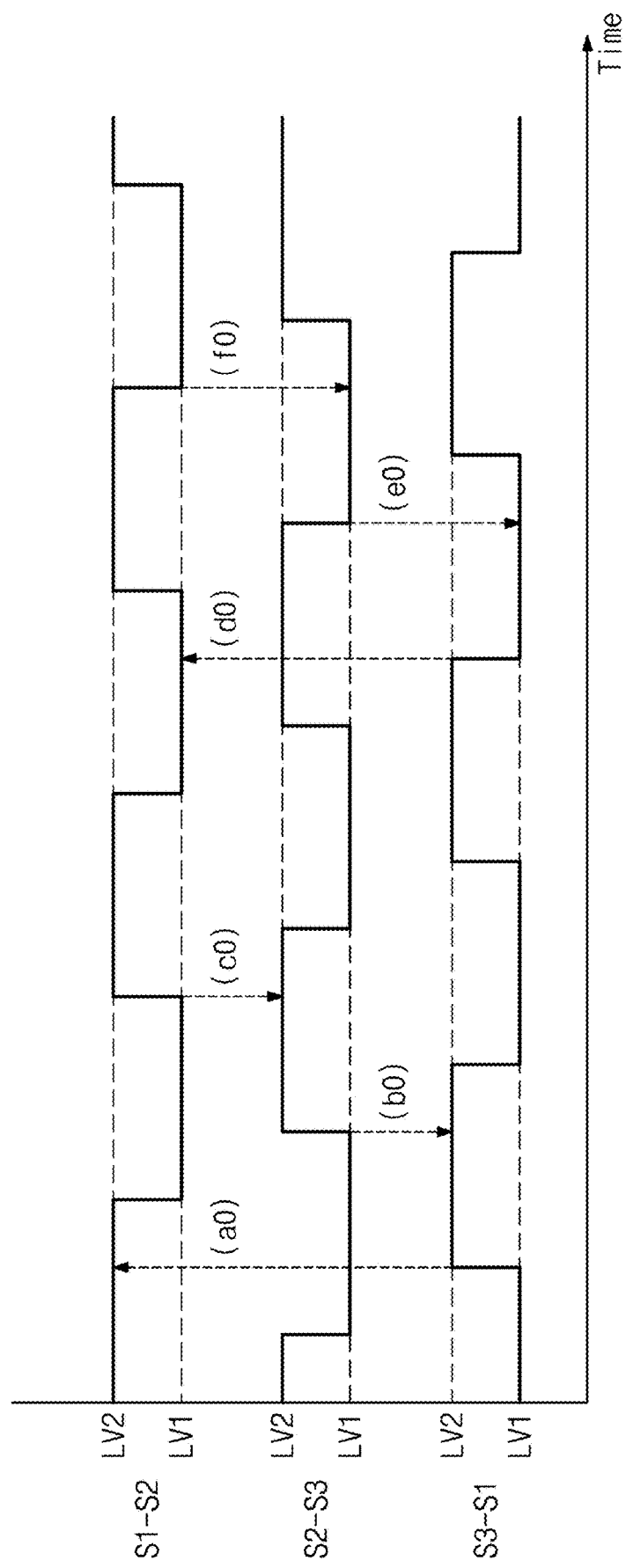
FIG. 6 is a graph for describing an example embodiment of a preamble option pattern.

FIG. 6 is a graph for describing an example embodiment of a preamble option pattern. In FIG. 6, a horizontal axis represents a time, and a vertical axis represents difference signals S1-S2, S2-S3, and S3-S1 of signal pairs selected from the signals S1, S2, and S3.

The "preamble option pattern" may mean an option pattern that is defined by a protocol, for example the C-PHY protocol, so as to be indicated by the signals S1, S2, and S3 in the preamble interval. The high speed mode verifying circuit 260 of FIG. 1 may calculate the difference signals S1-S2, S2-S3, and S3-S1. The difference signals S1-S2, S2-S3, and S3-S1 of pairs of the signals S1, S2, and S3 indicating preamble option pattern "3" are illustrated in FIG. 6.

When a voltage level of the difference signal S3-S1 transitions from a first voltage level LV1 to a second voltage level LV2, a voltage level of the difference signal S1-S2 may be the second voltage level LV2. In operation a0, the high speed mode verifying circuit 260 may verify whether a voltage level of the difference signal S1-S2 is the second voltage level LV2. The first voltage level LV1 and the second voltage level LV2 may respectively be a voltage level of the ground voltage VSS and a voltage level of the supply voltage VDD, but is not limited thereto.

When a voltage level of the difference signal S2-S3 transitions from the first voltage level LV1 to the second voltage level LV2, a voltage level of the difference signal S3-S1 may be the second voltage level LV2. In operation b0, the high speed mode verifying circuit 260 may verify whether a voltage level of the difference signal S3-S1 is the second voltage level LV2.

When a voltage level of the difference signal S1-S2 transitions from the first voltage level LV1 to the second voltage level LV2, a voltage level of the difference signal S2-S3 may be the second voltage level LV2. In operation c0, the high speed mode verifying circuit 260 may verify whether a voltage level of the difference signal S2-S3 is the second voltage level LV2.

When a voltage level of the difference signal S3-S1 transitions from the second voltage level LV2 to the first voltage level LV1, a voltage level of the difference signal S1-S2 may be the first voltage level LV1. In operation d0, the high speed mode verifying circuit 260 may verify whether a voltage level of the difference signal S1-S2 is the first voltage level LV1.

When a voltage level of the difference signal S2-S3 transitions from the second voltage level LV2 to the first voltage level LV1, a voltage level of the difference signal S3-S1 may be the first voltage level LV1. In operation e0, the high speed mode verifying circuit 260 may verify whether a voltage level of the difference signal S3-S1 is the first voltage level LV1.

When a voltage level of the difference signal S1-S2 transitions from the second voltage level LV2 to the first voltage level LV1, a voltage level of the difference signal S2-S3 may be the first voltage level LV1. In operation f0, the high speed mode verifying circuit 260 may verify whether a voltage level of the difference signal S2-S3 is the first voltage level LV1.

When the signals S1, S2, and S3 indicate preamble option pattern "3" is verified based on the operation a0 to operation f0, the high speed mode verifying circuit 260 may output the control signal CS2.

An example embodiment is described with reference to FIG. 6 as the high speed mode verifying circuit 260 operates in order from operation a0 to operation f0 for the purpose of verifying an option pattern, but the example embodiment is not limited thereto. For example, the verification of the high speed mode verifying circuit 260 may be performed from any one of operation a0 to operation f0.

Figure 7:
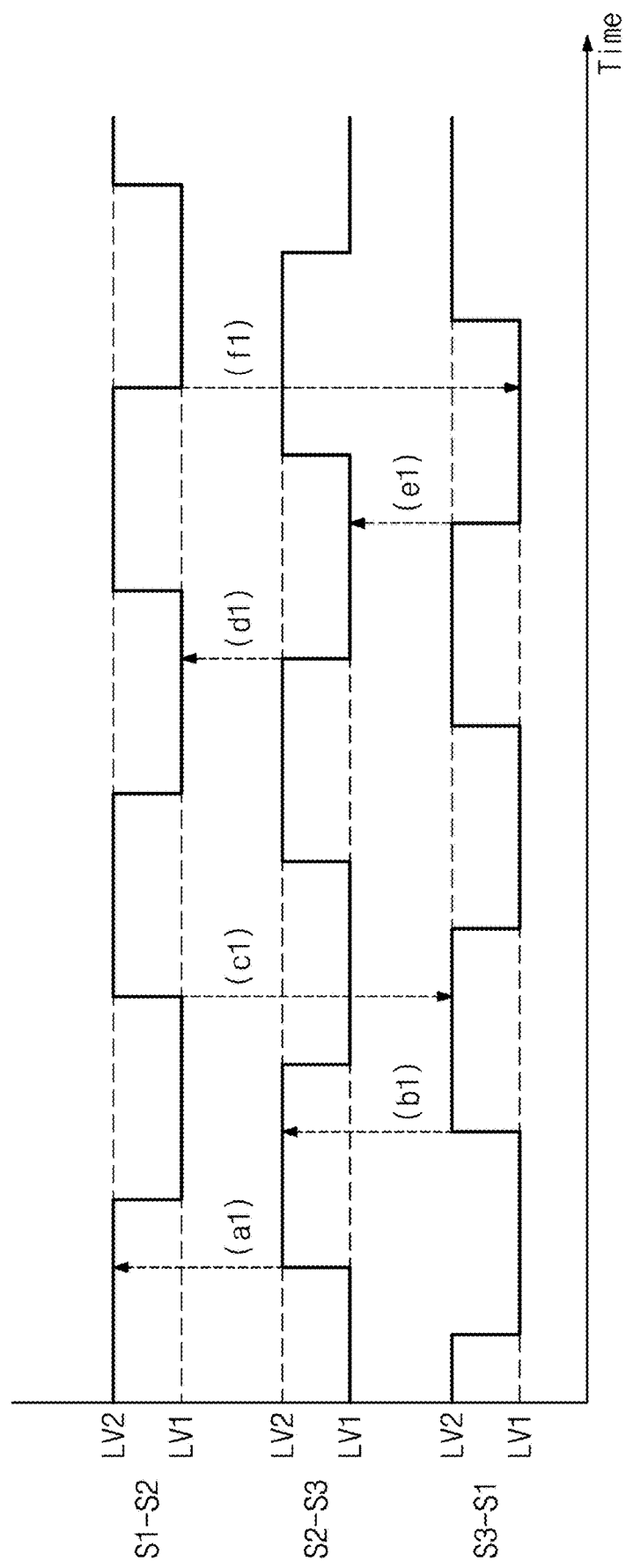
FIG. 7 is a graph for describing an example embodiment of a preamble option pattern.

FIG. 7 is a graph for describing an example embodiment of a preamble option pattern. In FIG. 7, a horizontal axis represents a time, and a vertical axis represents difference signals S1-S2, S2-S3, and S3-S1 of signal pairs selected from the signals S1, S2, and S3.

The difference signals S1-S2, S2-S3, and S3-S1 of pairs of the signals S1, S2, and S3 indicating preamble option pattern "1" are illustrated in FIG. 7.

When a voltage level of the difference signal S2-S3 transitions from the first voltage level LV1 to the second voltage level LV2, a voltage level of the difference signal S1-S2 may be the second voltage level LV2. In operation a1, the high speed mode verifying circuit 260 may verify whether a voltage level of the difference signal S1-S2 is the second voltage level LV2.

When a voltage level of the difference signal S3-S1 transitions from the first voltage level LV1 to the second voltage level LV2, a voltage level of the difference signal S2-S3 may be the second voltage level LV2. In operation b1, the high speed mode verifying circuit 260 may verify whether a voltage level of the difference signal S2-S3 is the second voltage level LV2.

When a voltage level of the difference signal S1-S2 transitions from the first voltage level LV1 to the second voltage level LV2, a voltage level of the difference signal S3-S1 may be the second voltage level LV2. In operation c1, the high speed mode verifying circuit 260 may verify whether a voltage level of the difference signal S3-S1 is the second voltage level LV2.

When a voltage level of the difference signal S2-S3 transitions from the second voltage level LV2 to the first voltage level LV1, a voltage level of the difference signal S1-S2 may be the first voltage level LV1. In operation d1, the high speed mode verifying circuit 260 may verify whether a voltage level of the difference signal S1-S2 is the first voltage level LV1.

When a voltage level of the difference signal S3-S1 transitions from the second voltage level LV2 to the first voltage level LV1, a voltage level of the difference signal S2-S3 may be the first voltage level LV1. In operation e1, the high speed mode verifying circuit 260 may verify whether a voltage level of the difference signal S2-S3 is the first voltage level LV1.

When a voltage level of the difference signal S1-S2 transitions from the second voltage level LV2 to the first voltage level LV1, a voltage level of the difference signal S3-S1 may be the first voltage level LV1. In operation f1, the high speed mode verifying circuit 260 may verify whether a voltage level of the difference signal S3-S1 is the first voltage level LV1.

When that the signals S1, S2, and S3 indicate preamble option pattern "1" is verified based on the operation a1 to operation f1, the high speed mode verifying circuit 260 may output the control signal CS2.

An example embodiment is described with reference to FIG. 7 as the high speed mode verifying circuit 260 operates in order from operation a1 to operation f1 for the purpose of verifying an option pattern, but the example embodiment is not limited thereto. For example, the verification of the high speed mode verifying circuit 260 may be performed from any one of operation a1 to operation f1.

Figure 8:
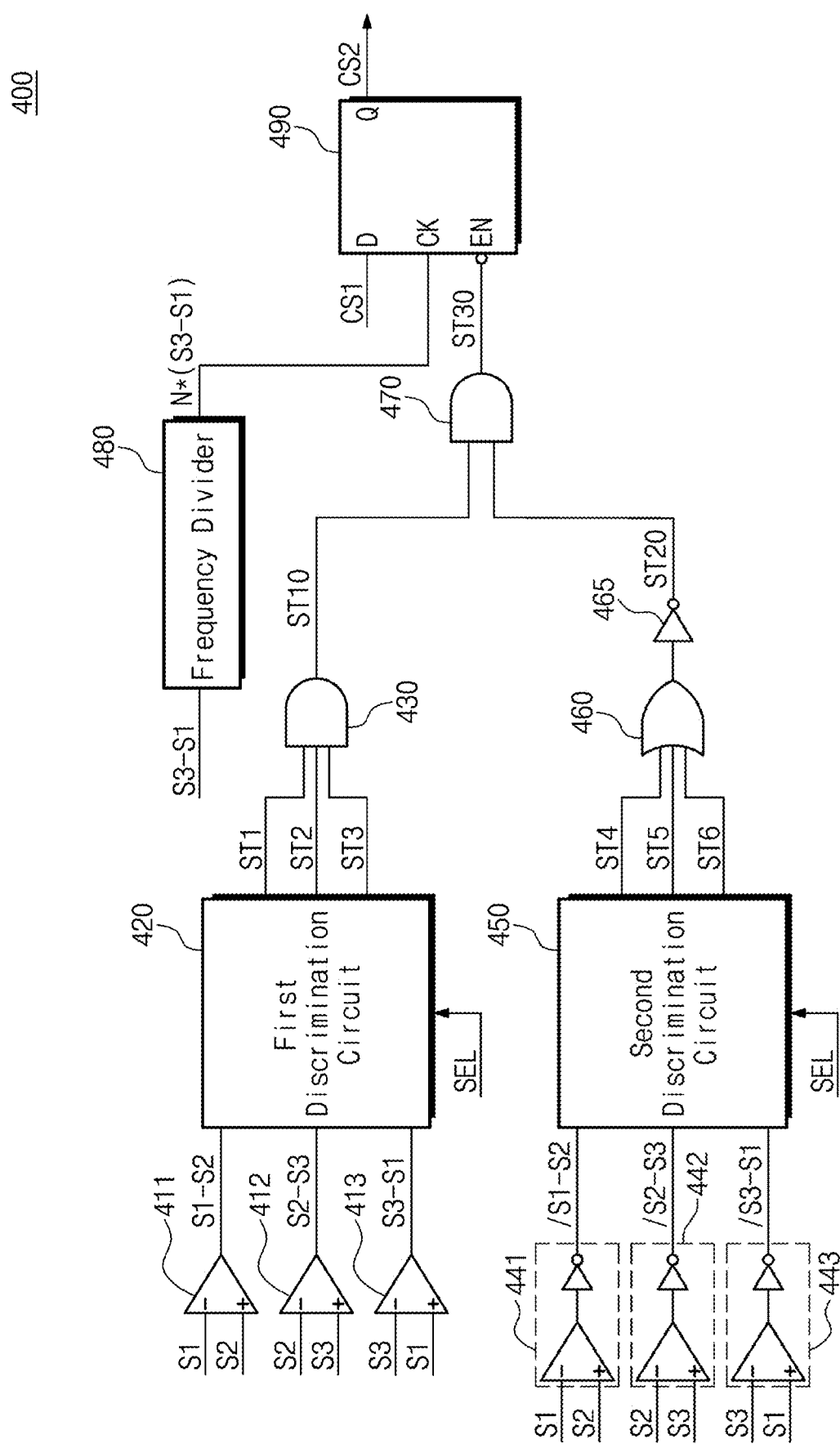
FIG. 8 is an example block diagram of a high speed verifying circuit of FIG. 1.

FIG. 8 is an example block diagram of a high speed verifying circuit of FIG. 1.

A high speed verifying circuit 400 of FIG. 8 may be understood as an example configuration of the high speed mode verifying circuit 260 of FIG. 1 configured to verify that the preamble interval has begun, based on the signals S1, S2, and S3. Referring to FIG. 8, the high speed verifying circuit 400 may include logic gates 411 to 413, 430, 441 to 443, 460, 465, and 470, a first discrimination circuit 420, a second discrimination circuit 450, a divider 480, and a toggle switch 490.

An example embodiment will be described with reference to FIG. 8 as the second discrimination circuit 450 receives inverted difference signals /S1-S2, /S2-S3, and /S3-S1 from the separate logic gates 441 to 443, but example embodiment is not limited thereto. The high speed verifying circuit 400 may only include a set of logic gates 411 to 413. In this case, the first discrimination circuit 420 and the second discrimination circuit 450 may share the logic gates 411 to 413. Inverters of the logic gates 441 to 443 can operate based on the difference signals S1-S2, S2-S3, and S3-S1 received from the logic gates 411 to 413.

The high speed verifying circuit 400 may share the logic gates 251 to 253 with the high speed mode detecting circuit 250 of FIG. 4. In this case, the high speed mode verifying circuit 260 may not separately include differential amplifiers of the logic gates 411 to 413 and the logic gates 441 to 443. The high speed verifying circuit 400 can operate the difference signals S1-S2, S2-S3, and S3-S1 received from the logic gates 251 to 253.

The logic gates 411 to 413 may receive signal pairs selected from the signals S1, S2, and S3. The logic gates 411 to 413 may generate the difference signals S1-S2, S2-S3, and S3-S1, based on differences of voltage levels of signal pairs. For example, each of the logic gates 411 to 413 may operate as a differential amplifier.

The first discrimination circuit 420 may receive the difference signals S1-S2, S2-S3, and S3-S1. The first discrimination circuit 420 may receive a selection signal SEL. The selection signal SEL may be decided by a preamble option pattern defined by a protocol, for example, the C-PHY protocol.

When the preamble option pattern is "3," the first discrimination circuit 420 may perform operation a0 to operation c0 of FIG. 6, based on the selection signal SEL and the difference signals S1-S2, S2-S3, and S3-S1. State signals ST1, ST2, and ST3 may be respectively output as results of operation a0 to operation c0. The state signals ST1, ST2, and ST3 may be decided by the difference signals S1-S2, S2-S3, and S3-S1 respectively in operation a0 to operation c0. For example, voltage levels of the state signals ST1, ST2, and ST3 may be voltage levels of the difference signals S1-S2, S2-S3, and S3-S1 respectively in operation a0 to operation c0.

When the preamble option pattern is "1," the first discrimination circuit 420 may perform operation a1 to operation c1 of FIG. 7, based on the selection signal SEL and the difference signals S1-S2, S2-S3, and S3-S1. The state signals ST1, ST2, and ST3 may be respectively output as results of operation a1 to operation c1. The state signals ST1, ST2, and ST3 may be decided by the difference signals S1-S2, S2-S3, and S3-S1 respectively in operation a1 to operation c1. For example, voltage levels of the state signals ST1, ST2, and ST3 may be voltage levels of the difference signals S1-S2, S2-S3, and S3-S1 respectively in operation a1 to operation c1.

The logic gate 430 may receive the state signals ST1, ST2, and ST3. The logic gate 430 may perform an AND operation on the state signals ST1, ST2, and ST3 to generate a signal ST10.

When the preamble option pattern defined by the protocol (e.g., the C-PHY protocol) is "3" and the difference signals S1-S2, S2-S3, and S3-S1 do not have the voltage levels illustrated in FIG. 6 in operation a0 to operation c0, the signal ST10 may have the first logical value. When the preamble option pattern defined by the protocol is "3" and the difference signals S1-S2, S2-S3, and S3-S1 have the voltage levels illustrated in FIG. 6 in operation a0 to operation c0, the signal ST10 may have the second logical value. The first logical value and the second logical value may be a logical value of "0" and a logical value of "1," respectively.

When the preamble option pattern defined by the protocol is "1" and the difference signals S1-S2, S2-S3, and S3-S1 do not have the voltage levels illustrated in FIG. 7 in operation a1 to operation c1, the signal ST10 may have the first logical value. When the preamble option pattern defined by the protocol is "F" and the difference signals S1-S2, S2-S3, and S3-S1 have the voltage levels illustrated in FIG. 7 in operation a1 to operation c1, the signal ST10 may have the second logical value.

The logic gates 441 to 443 may receive signal pairs selected from the signals S1, S2, and S3. The logic gates 441 to 443 may generate the inverted difference signals /S1-S2, /S2-S3, and /S3-S1, based on differences of voltage levels of the signal pairs. The inverted difference signals /S1-S2, /S2-S3, and /S3-S1 may be signals, the phases of which are opposite to phases of the difference signals S1-S2, S2-S3, and S3-S1. For example, each of the logic gates 411 to 413 may include a differential amplifier and an inverter.

The second discrimination circuit 450 may receive the inverted difference signals /S1-S2, /S2-S3, and /S3-S1. The second discrimination circuit 450 may receive the selection signal SEL.

When the preamble option pattern is "3", the first discrimination circuit 420 may perform operation d0 to operation f0 of FIG. 6, based on the selection signal SEL and the inverted difference signals /S1-S2, /S2-S3, and /S3-S1. State signals ST4, ST5, and ST6 may be respectively output as results of operation d0 to operation f0. The state signals ST4, ST5, and ST6 may be decided by the difference signals S1-S2, S2-S3, and S3-S1 respectively in operation d0 to operation f0. For example, voltage levels of the state signals ST4, ST5, and ST6 may be voltage levels of the difference signals S1-S2, S2-S3, and S3-S1 respectively in operation d0 to operation f0.

When the preamble option pattern is "1", the first discrimination circuit 420 may perform operation d1 to operation f1 of FIG. 7, based on the selection signal SEL and the inverted difference signals /S1-S2, /S2-S3, and /S3-S1. The state signals ST4, ST5, and ST6 may be respectively output as results of operation d1 to operation f1. The state signals ST4, ST5, and ST6 may be decided by the difference signals S1-S2, S2-S3, and S3-S1 respectively in operation d1 to operation f1. For example, voltage levels of the state signals ST4, ST5, and ST6 may be voltage levels of the difference signals S1-S2, S2-S3, and S3-S1 respectively in operation d1 to operation f1.

The logic gate 460 may receive the state signals ST4, ST5, and ST6. The logic gate 460 may perform an OR operation on the state signals ST4, ST5, and ST6. The logic gate 465 may invert a phase of a signal output from the logic gate 460 and may generate a signal ST20.

When the preamble option pattern defined by the protocol is "3" and the difference signals S1-S2, S2-S3, and S3-S1 do not have the voltage levels illustrated in FIG. 6 in operation d0 to operation f0, the signal ST20 may have the first logical value. When the preamble option pattern defined by the protocol is "3" and the difference signals S1-S2, S2-S3, and S3-S1 have the voltage levels illustrated in FIG. 6 in operation d0 to operation f0, the signal ST20 may have the second logical value.

When the preamble option pattern defined by the protocol is "1" and the difference signals S1-S2, S2-S3, and S3-S1 do not have the voltage levels illustrated in FIG. 7 in operation d1 to operation f1, the signal ST10 may have the first logical value. When the preamble option pattern defined by the protocol is "1" and the difference signals S1-S2, S2-S3, and S3-S1 have the voltage levels illustrated in FIG. 7 in operation d1 to operation f1, the signal ST20 may have the second logical value.

The logic gate 470 may receive the signals ST10 and ST20. The logic gate 470 may perform an AND operation on the signals ST10 and ST20 to generate a signal ST30.

The divider 480 may receive one of the difference signals S1-S2, S2-S3, and S3-S1. In descriptions below, the divider 480 receives the difference signal S3-S1, but the example embodiment is not limited thereto. The divider 480 may divide the difference signal S3-S1 to generate a divided signal "N*(S3-S1)". A period of the divided signal "N*(S3-S1)" may be N times a period of the difference signal S3-S1. Here, "N" may be a natural number. The accuracy of verification of the preamble interval may be adjusted by adjusting "N." For example, the accuracy of verification of the preamble interval may be increased by increasing "N."

The toggle switch 490 may output the control signal CS1, the divided signal "N*(S3−S1)", and the signal ST30. The toggle switch 490 may receive the control signal CS1, the divided signal "N*(S3−S1)", and the signal ST30 through an input terminal, a clock terminal, and an enable terminal, respectively. The toggle switch 490 may generate the control signal CS2, based on the control signal CS1, the divided signal "N*(S3−S1)", and the signal ST30. When, at a time when the divided signal "N*(S3−S1)" transitions, the control signal CS1 has the second logical value and the signal ST30 outputs the second logical value, the control signal CS2 may have the second logical value. For example, the toggle switch 490 may be a data ("D") flip-flop.

Figure 9:
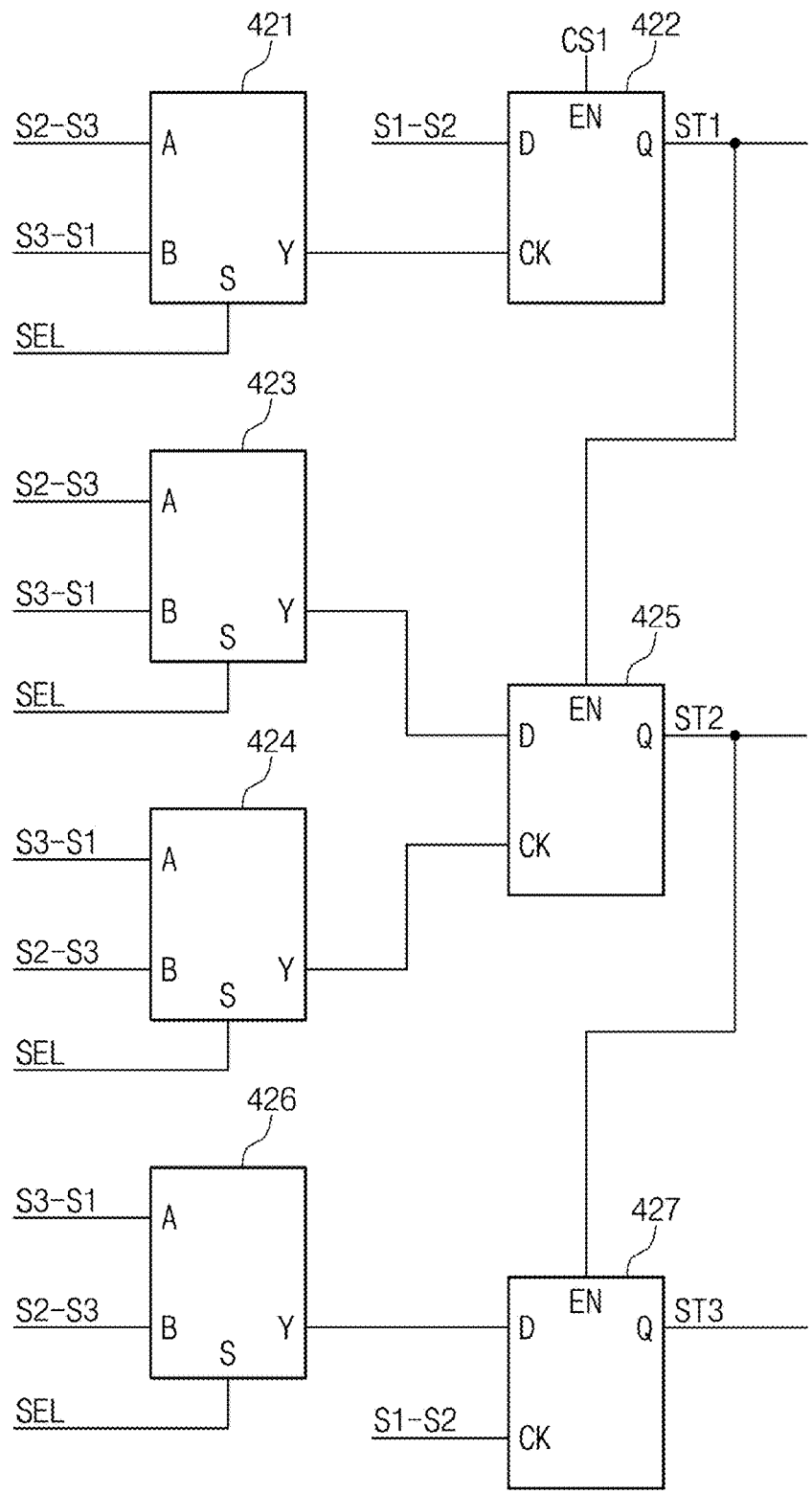
FIG. 9 is an example block diagram of a first discrimination circuit of FIG. 8.

FIG. 9 is an example block diagram of a first discrimination circuit of FIG. 8.

The first discrimination circuit 420 of FIG. 9 may include selectors 421, 423, 424, and 426 and toggle switches 422, 425, and 427. At least one of the selectors 421, 423, 424, and 426 may be a multiplexer. In the following description to be given with reference to FIG. 9, the preamble option pattern defined by the protocol is "1," but the example embodiments are not limited thereto.

The selector 421 may receive the difference signals S2-S3 and S3-S1 through an "A" terminal and a "B" terminal. The selector 421 may select one of the difference signals S2-S3 and S3-S1, based on the selection signal SEL. For example, when the preamble option pattern defined by a protocol, for example the C-PHY protocol, is "1" the difference signal S2-S3 received through the "A" terminal may be selected by the selection signal SEL. When the preamble option pattern defined by the protocol is "3," the difference signal S3-S1 received through the "B" terminal may be selected by the selection signal SEL. When the preamble option pattern is "1," the selector 421 may output the difference signal S2-S3 selected by the selection signal SEL through a "Y" terminal.

By a user, a configuration may be made in such a way that only components associated with the option pattern defined by the protocol from among components of the high speed mode verifying circuit 260 are activated. When the preamble option pattern defined by the protocol is "1," "B" terminals of the selectors 421 to 426 may be set to be deactivated. Even when the selection signal SEL is not input to the selectors 421 to 426 or is input to the selectors 421 to 426, the difference signal S2-S3 input to the "A" terminal may be output regardless of the selection signal SEL.

The toggle switch 422 may receive the control signal CS1, the difference signal S1-S2, and the difference signal S2-S3 output from the selector 421. When a logical value of the control signal CS1 is the first logical value, the toggle switch 422 may output the state signal ST1, based on the difference signal S1-S2 at a rising edge of the difference signal S2-S3. In detail, the state signal ST1 may have a voltage level of the difference signal S1-S2 at the rising edge of the difference signal S2-S3. When the voltage level of the difference signal S1-S2 is the second voltage level LV2 at the rising edge of the difference signal S2-S3, the voltage level of the state signal ST1 may also be the second voltage level LV2. That is, the selector 421 and the toggle switch 422 may perform operation a1 of FIG. 7.

The selector 423 may receive the difference signals S2-S3 and S3-S1 through an "A" terminal and a "B" terminal, respectively. The selector 423 may select one of the difference signals S2-S3 and S3-S1, based on the selection signal SEL. For example, when the preamble option pattern defined by the protocol is "1," the difference signal S2-S3 received through the "A" terminal may be selected by the selection signal SEL. When the preamble option pattern defined by the protocol is "3," the difference signal S3-S1 received through the "B" terminal may be selected by the selection signal SEL. When the preamble option pattern is "1," the selector 423 may output the difference signal S2-S3 selected by the selection signal SEL through a "Y" terminal.

Through operations similar to the operations of the selector 421 and the toggle switch 422, the selector 424 and the toggle switch 425 may perform operation b1 of FIG. 7. However, the toggle switch 425 may receive the state signal ST1 instead of the control signal CS1 through a gate terminal. Also, the toggle switch 425 may receive the difference signal S2-S3 output from the selector 423 through an input terminal.

Also, through operations similar to the operations of the selector 421 and the toggle switch 422, the selector 426 and the toggle switch 427 may perform operation c1 of FIG. 7. However, the toggle switch 427 may receive the state signal ST2 instead of the control signal CS1 through a gate terminal.

Figure 10:
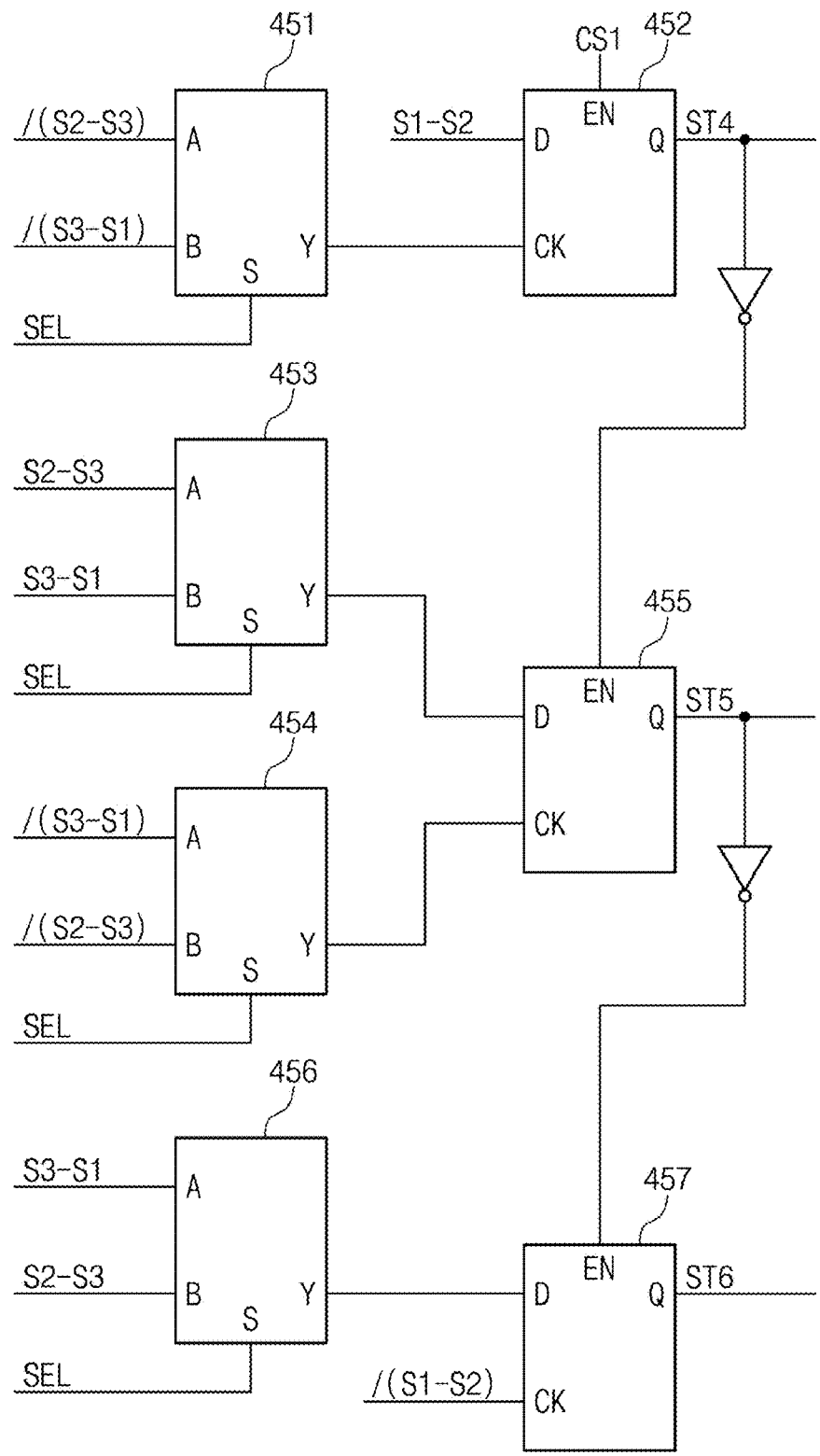
FIG. 10 is an example block diagram of a second discrimination circuit of FIG. 8.

FIG. 10 is an example block diagram of a second discrimination circuit of FIG. 8.

A second discrimination circuit 450 of FIG. 10 may include selectors 451, 453, 454, and 456 and toggle switches 452, 455, and 457. In the following description to be given with reference to FIG. 9, the preamble option pattern defined by the protocol is "1," but the example embodiments are not limited thereto.

The selector 451 may receive the inverted difference signals /S2-S3 and /S3-S1 through an "A" terminal and a "B" terminal, respectively. The selector 451 may select one of the inverted difference signals /S2-S3 and /S3-S1, based on the selection signal SEL. For example, when the preamble option pattern defined by the protocol is "1," the inverted difference signal /S2-S3 received through the "A" terminal may be selected by the selection signal SEL. When the preamble option pattern defined by the protocol is "3," the inverted difference signal /S3-S1 received through the "B" terminal may be selected by the selection signal SEL. The selector 451 may output the inverted difference signal /S2-S3 selected by the selection signal SEL through a "Y" terminal.

By the user, a configuration may be made in such a way that components associated with the option pattern defined by the protocol from among components of the high speed mode verifying circuit 260 are activated. For example, only the components associated with the option pattern may be activated. When the preamble option pattern defined by the protocol is "1," "B" terminals of the selectors 451 to 456 may be set to be deactivated. Even when the selection signal SEL is not input to the selectors 451 to 456 or is input to the selectors 451 to 456, the inverted difference signal /S2-S3 input to the "A" terminal may be output regardless of the selection signal SEL.

The toggle switch 452 may receive the control signal CS1, the difference signal S1-S2, and the inverted difference signal /S2-S3 output from the selector 451. When a logical value of the control signal CS1 is the first logical value, the toggle switch 452 may output a state signal ST4, based on the difference signal S1-S2 at a rising edge of the inverted difference signal /S2-S3. In detail, the state signal ST1 may have a voltage level of the difference signal S1-S2 at the rising edge of the inverted difference signal /S2-S3. When the voltage level of the difference signal S1-S2 is the first voltage level LV1 at the rising edge of the inverted difference signal /S2-S3, the voltage level of the state signal ST1 may also be the first voltage level LV1. That is, the selector 451 and the toggle switch 452 may perform operation d1 of FIG. 7.

The selector 453 may receive the difference signals S2-S3 and S3-S1 through an "A" terminal and a "B" terminal, respectively. The selector circuit 453 may select one of the difference signals S2-S3 and S3-S1, based on the selection signal SEL. For example, when the preamble option pattern defined by the protocol is "1," the difference signal S2-S3 received through the "A" terminal may be selected by the selection signal SEL. When the preamble option pattern defined by the protocol is "3," the difference signal S3-S1 received through the "B" terminal may be selected by the selection signal SEL. When the preamble option pattern is "1," the selector 423 may output the difference signal S2-S3 selected by the selection signal SEL through a "Y" terminal. Through operations similar to the operations of the selector 451 and the toggle switch 452, the selector 454 and the toggle switch 455 may perform operation e1 of FIG. 7. However, the toggle switch 454 may receive an inverted state signal /ST4 instead of the control signal CS1 through a gate terminal. The inverted state signal /ST4 may be an output signal of an inverter connected with an output of the toggle switch 452, that is, a signal, the phase of which is opposite to a phase of the state signal ST4. Also, through operations similar to the operations of the selector 451 and the toggle switch 452, the selector 456 and the toggle switch 457 may perform operation f1 of FIG. 7. However, the toggle switch 456 may receive an inverted state signal /ST5 instead of the control signal CS1 through a gate terminal. The inverted state signal /ST5 may be an output signal of an inverter connected with an output of the toggle switch 455, that is, a signal, the phase of which is opposite to a phase of the state signal ST5.

Referring to FIGS. 9 and 10, the high speed mode verifying circuit 400 of FIG. 8 may verify that the preamble interval begins, by detecting an option pattern through operation a1 to operation f1. However, the example embodiment is not limited thereto. For example, the high speed mode verifying circuit 400 may differently perform the order from operation a1 to operation f1. In the case where the order from operation a1 to operation f1 to be performed is changed, the components 421 to 427 of FIG. 9 and signals to be input to the components 451 to 457 may change so as to be appropriate for the changed order.

Figure 11:
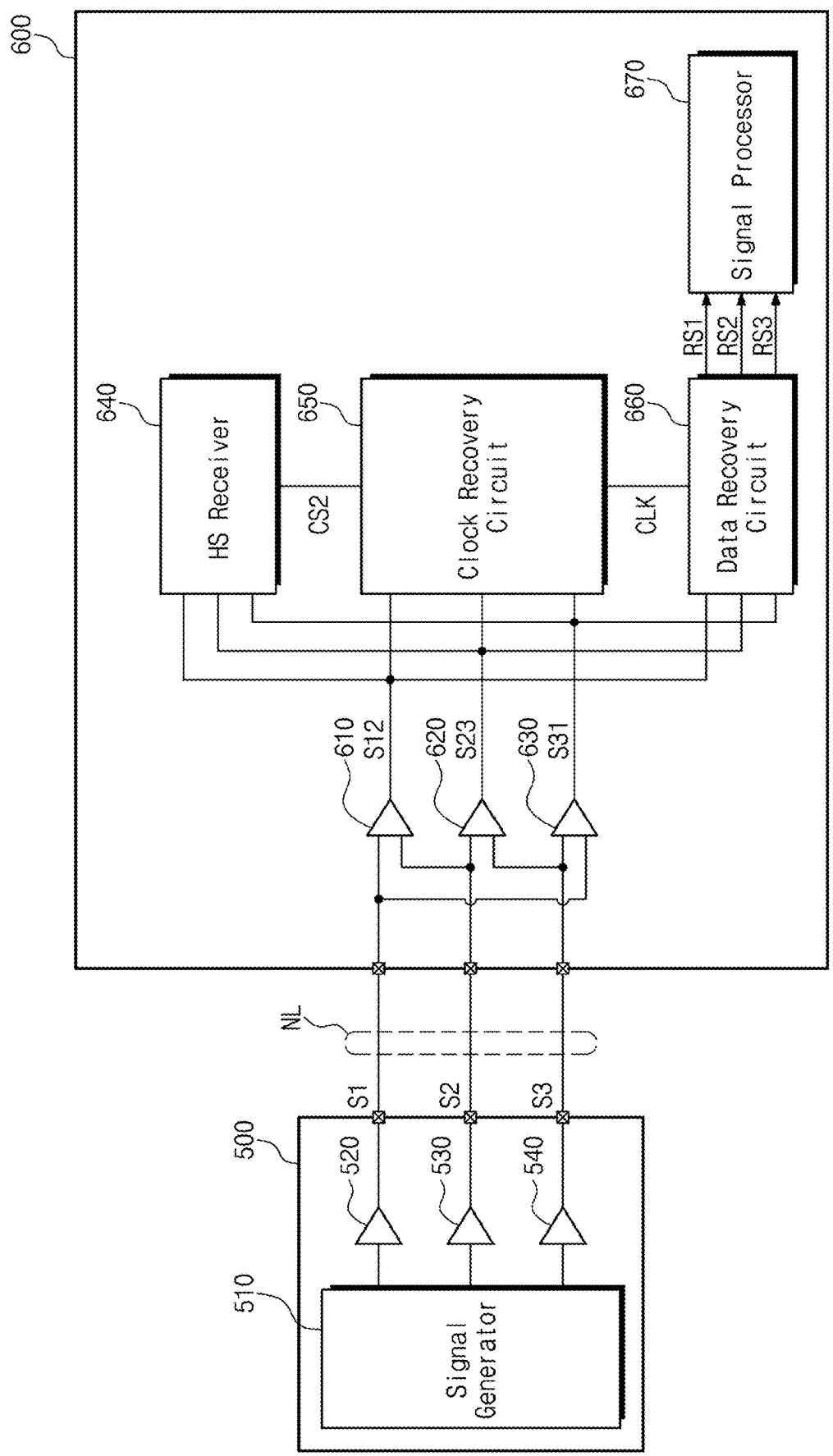
FIG. 11 is a block diagram for describing an operation of a clock recovery circuit of FIG. 1.

FIG. 11 is a block diagram for describing an operation of a clock recovery circuit of FIG. 1.

A first electronic device 500 and a second electronic device 600 may provide substantially the same operations as the first electronic device 100 and the second electronic device 200 of FIG. 1. Thus, additional description will be omitted to avoid redundancy.

The first electronic device 500 may output the signals S1, S2, and S3 through three communication lines NL. The second electronic device 600 may receive the signals S1, S2, and S3. Logic gates 610 to 630 may receive signal pairs differently selected from the signals S1, S2, and S3. The logic gates 610 to 630 may receive the signal pairs to generate difference signals S12, S23, and S31.

Although omitted for clarity, the second electronic device 600 may further include the receivers 210 to 230 and the low speed mode receiver 240 of FIG. 1. The second electronic device 600 may output the control signal CS0 in the preparation interval through the receivers 210 to 230 and the low speed mode receiver 240.

A high speed mode receiver 640 may generate the control signal CS2, based on the control signal CS0 and the difference signals S12, S23, and S31. The control signal CS2 may indicate whether the preamble interval begins.

A clock recovery circuit 650 may receive the control signal CS2 and the difference signals S12, S23, and S31. When the control signal CS2 is received, the clock recovery circuit 650 may recover a clock signal CLK from the difference signals S12, S23, and S31.

In each unit interval, the clock recovery circuit 650 may allow the clock signal CLK to transition to a high level as one of the difference signals S12, S23, and S31 transitions. The unit interval may mean 1 UI (Unit Interval). Afterwards, when the remaining signals of the difference signals S12, S23, and S31 transition in the same symbol interval, the clock recovery circuit 650 may maintain the level of the clock signal CLK without a transition of the clock signal CLK. The clock recovery circuit 650 may maintain the level of the clock signal CLK by masking the clock signal CLK during a given time within a range from 0.3 UI to 0.6 UI after the clock signal CLK transitions in each unit interval.

After the given time elapses, the clock recovery circuit 650 may transition the clock signal CLK to a low level. That is, the clock recovery circuit 650 may generate the clock signal CLK, of which a period corresponds to the unit interval.

A data recovery circuit 660 may receive the difference signals S12, S23, and S31 and the clock signal CLK. The data recovery circuit 660 may delay the difference signals S12, S23, and S31. For example, the data recovery circuit 660 may adjust a delay amount so as to facilitate a latching of the difference signals S12, S23, and S31. For example, the delay amount may be about 0.5 UI and/or a value similar thereto.

The data recovery circuit 660 may respectively latch the delayed difference signals S12, S23, and S31 in synchronization with the clock signal CLK. The data recovery circuit 660 may output signals RS1, RS2, and RS3 as the latched results.

A signal processor 670 may receive the signals RS1, RS2, and RS3. The signal processor 670 may operate in response to the signals RS1, RS2, and RS3.

In an example embodiment, the first electronic device 500 may be an application processor (AP), and the second electronic device 600 may be a display device. For another example embodiment, the first electronic device 500 may be an image sensor, and the second electronic device 600 may be an application processor (AP).

Figure 12:
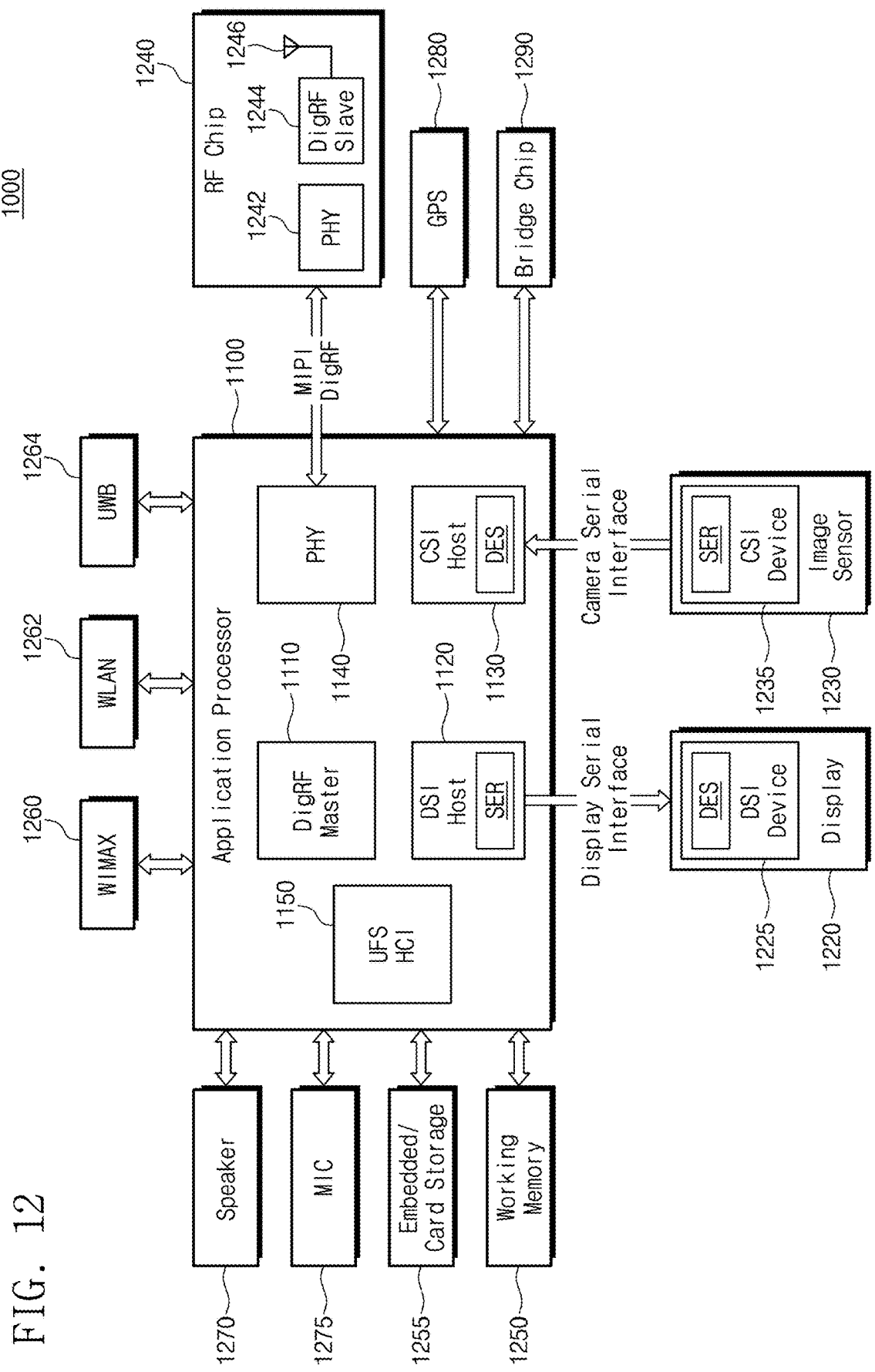
FIG. 12 illustrates an electronic device according to some example embodiments.

FIG. 12 illustrates an electronic device according to some example embodiments. An electronic device 1000 may be implemented with a data processing device configured to use and/or support an interface protocol, for example a protocol proposed by the MIPI alliance. The electronic device 1000 may be one of electronic devices such as a portable communication terminal, a personal digital assistant (PDA), a portable media player (PMP), a smartphone, a tablet computer, and a wearable device.

The electronic device 1000 may include an application processor 1100, a display 1220, and an image sensor 1230. The application processor 1100 may include a DigRF master 1110, a display serial interface (DSI) host 1120, a camera serial interface (CSI) host 1130, a physical layer 1140, and a universal flash storage host-controller interface (UFS HCI) 1150.

The DSI host 1120 may communicate with a DSI device 1225 of the display 1220 in compliance with the DSI. For example, a serializer SER may be implemented in the DSI host 1120, and a deserializer DES may be implemented in the DSI device 1225. For example, the DSI may use a physical layer, for example as defined in the C-PHY specification, and the DSI host 1120 may communicate with the DSI device 1225 through three or more communication lines. As described with reference to FIGS. 1 to 12, the DSI host 1120 and/or the DSI device 1225 may include delay cells including a feedback loop and may be configured to determine the unit interval UI through coarse detection and fine detection.

The CSI host 1130 may communicate with a CSI device 1235 of the image sensor 1230 in compliance with the CSI. For example, a deserializer DES may be implemented in the CSI host 1130, and a serializer SER may be implemented in the CSI device 1235. For example, the CSI may use a physical layer, for example as defined in the C-PHY specification, and the CSI host 1130 may communicate with the CSI device 1235 through three or more communication lines. As described with reference to FIGS. 1 to 12, the CSI host 1130 and/or the CSI device 1235 may include delay cells including a feedback loop and may be configured to determine the unit interval UI through coarse detection and fine detection.

The electronic device 1000 may further include a radio frequency (RF) chip 1240 that communicates with the application processor 1100. The RF chip 1240 may include a physical layer 1242, a DigRF slave 1244, and an antenna 1246. For example, the physical layer 1242 of the RF chip 1240 and the physical layer 1140 of the application processor 1100 may exchange data with each other through DigRF interface proposed by the MIPI alliance. In some example embodiments, in the case where the physical layers 1242 and 1140 communicate with each other through three or more communication lines, the physical layer 1242 and/or the physical layer 1140 may include delay cells including a feedback loop and may be configured to determine the unit interval UI through coarse detection and fine detection.

The electronic device 1000 may further include a working memory 1250 and an embedded/card storage device 1255. The working memory 1250 may temporarily store data processed or to be processed by the application processor 1100. The working memory 1250 may include a volatile memory such as a static random access memory (SRAM), a dynamic RAM (DRAM), or a synchronous DRAM (SDRAM), and/or a nonvolatile memory such as a flash memory, a phase-change RAM (PRAM), a magneto-resistive RAM (MRAM), a resistive RAM (ReRAM), or a ferro-electric RAM (FRAM).

The embedded/card storage device 1255 may store data provided from the application processor 1100 or may provide the stored data to the application processor 1100. The embedded/card storage device 1255 may include a nonvolatile memory that stores data regardless of whether power is supplied thereto.

For example, the embedded/card storage device 1255 may communicate with the application processor 1100 based on the UFS communication protocol. In this example, the application processor 1100 may process communication with the embedded/card storage device 1255 through the UFS HCI 1150. In some embodiments, in the case where the embedded/card storage device 1255 communicates with the application processor 1100 through three or more communication lines, the embedded/card storage device 1255 and/or the application processor 1100 may include delay cells including a feedback loop and may be configured to determine the unit interval UI through coarse detection and fine detection.

The electronic device 1000 may communicate with an external device/system through communication modules, such as a worldwide interoperability for microwave access (WiMAX) 1260, a wireless local area network (WLAN) 1262, and an ultra-wideband (UWB) 1264. The electronic device 1000 may further include a speaker 1270 and a microphone 1275, which are used to process voice information. The electronic device 1000 may further include a global positioning system (GPS) device 1280 for processing position information. The electronic device 1000 may further include a bridge chip 1290 for managing connection with peripheral devices.

In the above embodiments, components are described by using the terms "first," "second," "third," and the like. However, the terms "first", "second", "third", and the like may be used to distinguish components from each other and do not limit the example embodiments. For example, the terms "first," "second," "third," and the like do not involve an order or a numerical meaning of any form.

When the terms "about" or "substantially" are used in this specification in connection with a numerical value, it is intended that the associated numerical value includes a manufacturing tolerance (e.g., ±10%) around the stated numerical value. Further, regardless of whether numerical values or shapes are modified as "about" or "substantially," it will be understood that these values and shapes should be construed as including a manufacturing or operational tolerance (e.g., ±10%) around the stated numerical values or shapes.

In the above embodiments, components according to the example embodiments are described by using blocks. The blocks may include and/or be implemented by processing circuitry, including, but not limited to various hardware devices, such as an integrated circuit, an application specific IC (ASCI), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit or circuits enrolled as intellectual property (IP).

According to some example embodiments, an electronic device may detect a change of a power mode in a pre-begin interval. Also, a preamble interval may be prevented from being abnormally detected due to a noise, through operations of a high speed mode detecting circuit operating based on a current and a high speed mode verifying circuit detecting and operating an option pattern.

While the inventive concepts have been described with reference to some example embodiments thereof, it will be apparent to those of ordinary skill in the art that various changes and modifications may be made thereto without departing from the spirit and scope of the inventive concepts as set forth in the following claims.

What is claimed is:

1. An electronic device configured to switch a power mode from a first mode to a second mode as a first time interval and a second time interval sequentially pass, the electronic device comprising:
   a first mode receiver configured to output a first detection signal, based on at least three receive signals, when the first time interval begins;
   a second mode detector configured to output a second detection signal, based on the first detection signal and a change in voltage levels of the at least three receive signals, when the second time interval begins; and
   a second mode verifier configured to detect an option pattern generated by the at least three receive signals and verify that the second time interval has begun when the second detection signal is received.

2. The electronic device of claim 1, further comprising:
a clock recovery circuit configured to recover a clock signal from the at least three receive signals, when it is verified that the second time interval begins.

3. The electronic device of claim 1, wherein the at least three receive signals comply with a C-PHY protocol.

4. The electronic device of claim 1, wherein an amount of power that the electronic device consumes in the first mode is less than an amount of power that the electronic device consumes in the second mode.

5. The electronic device of claim 1, wherein the second mode detector includes
comparators configured to output comparison signals, the output comparison signals based on receive signal pairs differently selected from the at least three receive signals; and
a logic gate configured to perform a logical operation on the comparison signals and to output the second detection signal.

6. The electronic device of claim 5, wherein the comparators include
a current output circuit configured to receive one of the receive signal pairs and to output at least one of a first current and a second current;
a control circuit configured to adjust a first voltage level of a first node based on the first current and to adjust a second voltage level of a second node based on the second current;
a first switch circuit configured to output a third current to an output node based on the first voltage level; and
a second switch circuit configured to output a fourth current to the output node based on the second voltage level,
wherein a logical value of each of the comparison signals is based on a voltage level of the output node.

7. The electronic device of claim 1, wherein
when a voltage level of one of difference signals transitions, the second mode verifier is configured to detect the option pattern based on a voltage level of one of remaining difference signals, and
each of the difference signals is a signal obtained by subtracting one receive signal of a receive signal pair selected from the at least three receive signals from a remaining receive signal of the receive signal pair.

8. An electronic device configured to switch a power mode from a first mode to a second mode as a first time interval and a second time interval sequentially pass, the electronic device comprising:
a first mode receiver configured to output a first detection signal, based on a first signal, a second signal, and a third signal, when the first time interval begins; and
a second mode receiver configured to output the first detection signal and a second detection signal of a first logical value, the second detection signal based on a first signal pair including the first signal and the second signal, a second signal pair including the second signal and the third signal, and a third signal pair including the first signal and the third signal, and the first detection signal, when the second time interval begins, the second mode receiver includes
a first comparator configured to output a first comparison signal, based on first currents flowing by the first signal pair,
a second comparator configured to output a second comparison signal, based on second currents flowing by the second signal pair, and
a third comparator configured to output a third comparison signal, based on third currents flowing by the third signal pair, and
wherein the first logical value of the second detection signal is based on the first comparison signal, the second comparison signal, and the third comparison signal.

9. The electronic device of claim 8, wherein each of the first signal, the second signal, and the third signal have different voltage levels in the first time interval and the second time interval.

10. The electronic device of claim 8, wherein,
the second mode receiver is configured to output the first detection signal of a second logical value different from the first logical value when the first signal, the second signal, and the third signal have substantially identical voltage levels, and
the second mode receiver outputs the first detection signal of the first logical value when the first signal, the second signal, and the third signal do not have substantially identical voltage levels.

11. The electronic device of claim 8, wherein the second mode receiver further includes a logic gate configured to perform a logical operation on the first comparison signal, the second comparison signal, and the third comparison signal and to output the first detection signal.

12. The electronic device of claim 8, wherein the first comparator includes:
a current output circuit configured to output at least one of a first current and a second current, based on voltage levels of the first signal pair;
a control circuit configured to adjust a first voltage level of a first node based on the first current and to adjust a second voltage level of a second node based on the second current;
a first switch circuit configured to output a third current to an output node based on the first voltage level; and
a second switch circuit configured to output a fourth current to the output node, based on the second voltage level,
wherein a logical value of the first comparison signal is associated with a voltage level of the output node.

13. The electronic device of claim 12, wherein the current output circuit includes
a first transistor configured to receive the first signal and to output the first current; and
a second transistor configured to receive the second signal and to output the second current.

14. The electronic device of claim 12, wherein the control circuit includes
a first transistor configured to receive the first current and to adjust the first voltage level; and
a second transistor configured to receive the second current and to adjust the second voltage level,
wherein a gate terminal and a drain terminal of the first transistor are connected with the first node, and
wherein a gate terminal and a drain terminal of the second transistor are connected with the second node.

15. The electronic device of claim 12, wherein
the first switch circuit includes
a first current mirror circuit configured to output a fifth current to a third node based on the first voltage level; and a second current mirror circuit configured to output the third current to the output node based on a voltage level of the third node, and wherein the second switch circuit includes a third current mirror circuit configured to output a sixth current to a fourth node based on the second voltage level; and a fourth current mirror circuit configured to output the fourth current to the output node based on a voltage level of the fourth node.

16. An electronic device configured to switch a power mode from a first mode to a second mode as a first time interval and a second time interval sequentially pass, the electronic device comprising:

a first mode receiver configured to, when the first time interval begins, output a first detection signal, based on a first signal, a second signal, and a third signal; and a second mode receiver configured to detect an option pattern generated by a first difference signal being a difference between the first signal and the second signal, a second difference signal being a difference between the second signal and the third signal, and a third difference signal being a difference between the third signal and the first signal, and to verify that the second time interval begins, when the first detection signal is received, and the second mode receiver is configured to detect the option pattern, when a voltage level of the second difference signal transitions, based on a voltage level of the first difference signal.

17. The electronic device of claim 16, wherein the second mode receiver includes a first selector configured to select one of the second difference signal and the third difference signal, depending on the generated option pattern; and a first toggle switch configured to, when a voltage level of the one selected by the first selector transitions, output a first state signal having a voltage level substantially identical to the first difference signal, wherein the first mode receiver is configured to detect a first portion of the generated option pattern, based on the first state signal.

18. The electronic device of claim 17, wherein the second mode receiver further includes a second selector configured to select one difference signal of the second difference signal and the third difference signal, depending on the generated option pattern;

a third selector configured to select one difference signal of the second difference signal and the third difference signal, depending on the generated option pattern; and a second toggle switch configured to, when a voltage level of the one difference signal selected by the second selector transitions, output a second state signal having a voltage level substantially identical to the one difference signal selected by the third selector, and wherein the second mode receiver is configured to detect a second portion of the generated option pattern, based on the second state signal.

19. The electronic device of claim 17, wherein the second mode receiver further includes a second selector configured to select one of a first inverted difference signal and a second inverted difference signal, depending on the generated option pattern; and a second toggle switch configured to output a second state signal having a voltage level of the first inverted difference signal, when a voltage level of the one selected by the second selector transitions, wherein a phase of the first inverted difference signal is opposite to a phase of the first difference signal and a phase of the second inverted difference signal is opposite to a phase of the second difference signal, and wherein the second mode receiver is configured to detect a second portion of the generated option pattern based on the second state signal.

20. The electronic device of claim 17, wherein the first selector is a multiplexer, and wherein the first toggle switch is a data flip-flop including an input terminal receiving the first difference signal and a clock terminal receiving the one selected by the first selector.

* * * * *